United States Patent [19]

Namiki

[11] Patent Number: 5,703,787

[45] Date of Patent: Dec. 30, 1997

[54] WAVE ANALYZING APPARATUS AND WAVE ANALYZING METHOD

[75] Inventor: Takefumi Namiki, Kawasaki, Japan

[73] Assignee: Fujitsu Limited, Kawasaki, Japan

[21] Appl. No.: 606,822

[22] Filed: Feb. 26, 1996

[30] Foreign Application Priority Data

Jun. 28, 1995 [JP] Japan ................... 7-162565

[51] Int. Cl.$^6$ .............. G01S 7/36; G06F 11/20; G06F 12/12

[52] U.S. Cl. ........... 364/487; 364/254.3; 364/260.1; 395/800; 395/601; 395/497.01; 395/461; 371/40.4

[58] Field of Search ........... 364/254, 243, 364/254.3, 239, 250, 247, 260.1; 395/600, 461, 800, 440, 460, 483, 486, 481, 497.01, 448, 457, 470, 2.14; 342/18; 371/40.2, 40.4

[56] References Cited

U.S. PATENT DOCUMENTS

| | | | |
|---|---|---|---|
| 3,659,051 | 4/1972 | Kalfaian | 395/2.14 |
| 3,696,808 | 10/1972 | Roy et al. | 128/731 |
| 4,214,591 | 7/1980 | Sato et al. | 128/731 |
| 4,339,199 | 7/1982 | Jones et al. | 356/213 |
| 4,452,082 | 6/1984 | Miwa | 73/599 |
| 4,594,575 | 6/1986 | Avery et al. | 341/131 |
| 4,632,122 | 12/1986 | Johansson et al. | 128/644 |
| 4,683,892 | 8/1987 | Johansson et al. | 128/639 |
| 4,873,869 | 10/1989 | Fink | 73/626 |
| 4,996,532 | 2/1991 | Kirimoto et al. | 342/81 |
| 5,068,682 | 11/1991 | Utagawa | 396/104 |
| 5,265,617 | 11/1993 | Verrier et al. | 128/704 |
| 5,361,342 | 11/1994 | Tone | 395/448 |
| 5,402,782 | 4/1995 | Lodder | 128/653.1 |
| 5,485,475 | 1/1996 | Takagi | 371/40.4 |
| 5,539,859 | 7/1996 | Robbe et al. | 395/2.42 |
| 5,581,726 | 12/1996 | Tanaka | 395/461 |

Primary Examiner—Emanuel T. Voeltz
Assistant Examiner—Cuong M. Nguyen
Attorney, Agent, or Firm—Staas & Halsey

[57] ABSTRACT

A wave analyzing apparatus and method reduce the amount of time required for wave analysis. When changing wave data of a specified discrete point within an analysis domain expressed by a plurality of discrete points, the wave analyzing apparatus analyzes propagation of the changes in the form of spatial and time variations of wave data of other discrete points. The apparatus stores wave data about each of a plurality of discrete points forming the analysis domain, divides the analysis domain into a plurality of blocks, manages the blocks, determines whether magnitudes of the wave data about some pre-designated discrete points for determination contained in an interior of the block are all smaller than a predetermined value for every block managed, calculates for blocks in which the magnitudes of the wave data corresponding to the determination discrete points are determined to be smaller than the predetermined value, the wave data about the discrete points after a fixed time has elapsed on the basis of the wave data about the respective discrete points within these blocks (the wave data being stored), then treats, with respect to the blocks exclusive of the above-mentioned blocks, the wave data about the respective discrete points within these blocks that have been stored as wave data about those discrete points after the fixed time has elapsed.

16 Claims, 19 Drawing Sheets

| DETERMINATION DATA OF BLOCK 1 |
| --- |
| Ey (1, 26, 20, k)   (k= 1~100) |
| Ey (2, 26, 20, k)   (k= 1~  2) |

| DETERMINATION DATA OF BLOCK 2 |
| --- |
| Ey (1, 26, 20, k)   (k=99~100) |
| Ey (2, 26, 20, k)   (k= 1~100) |
| Ey (3, 26, 20, k)   (k= 1~  2) |

| DETERMINATION DATA OF BLOCK 3 |
| --- |
| Ey (2, 26, 20, k)   (k=99~100) |
| Ey (3, 26, 20, k)   (k= 1~100) |
| Ey (4, 26, 20, k)   (k= 1~  2) |

| DETERMINATION DATA OF BLOCK 4 |
| --- |
| Ey (3, 26, 20, k)   (k=99~100) |
| Ey (4, 26, 20, k)   (k= 1~100) |

FIG. 6

| | |
|---|---|
| BLOCK BL1 DATA<br>CALCULATION REQUIRED/NON-REQUIRED FLAG<br>NUMBER OF SPATIAL DISCRETE LATTICES<br>SPATIAL DISCRETE INTERVAL<br>FIDUCIAL LATTICE COORDINATE | FLG(1)<br>NX(1)=50, NY(1)=70, NZ(1)=100<br>dx(1)=1.0, dy(1)=0.8, dz(1)=2.0<br>BI(1)=1, BJ(1)=1, BK(1)=1 |
| BLOCK BL2 DATA<br>CALCULATION REQUIRED/NON-REQUIRED FLAG<br>NUMBER OF SPATIAL DISCRETE LATTICES<br>SPATIAL DISCRETE INTERVAL<br>FIDUCIAL LATTICE COORDINATE | FLG(2)<br>NX(2)=50, NY(2)=70, NZ(2)=100<br>dx(2)=1.0, dy(2)=0.8, dz(2)=2.0<br>BI(2)=1, BJ(2)=1, BK(2)=101 |
| BLOCK BL3 DATA<br>CALCULATION REQUIRED/NON-REQUIRED FLAG<br>NUMBER OF SPATIAL DISCRETE LATTICES<br>SPATIAL DISCRETE INTERVAL<br>FIDUCIAL LATTICE COORDINATE | FLG(3)<br>NX(3)=50, NY(3)=70, NZ(3)=100<br>dx(3)=1.0, dy(3)=0.8, dz(3)=2.0<br>BI(3)=1, BJ(3)=1, BK(3)=201 |
| BLOCK BL4 DATA<br>CALCULATION REQUIRED/NON-REQUIRED FLAG<br>NUMBER OF SPATIAL DISCRETE LATTICES<br>SPATIAL DISCRETE INTERVAL<br>FIDUCIAL LATTICE COORDINATE | FLG(4)<br>NX(4)=50, NY(4)=70, NZ(4)=100<br>dx(4)=1.0, dy(4)=0.8, dz(4)=2.0<br>BI(4)=1, BJ(4)=1, BK(4)=301 |

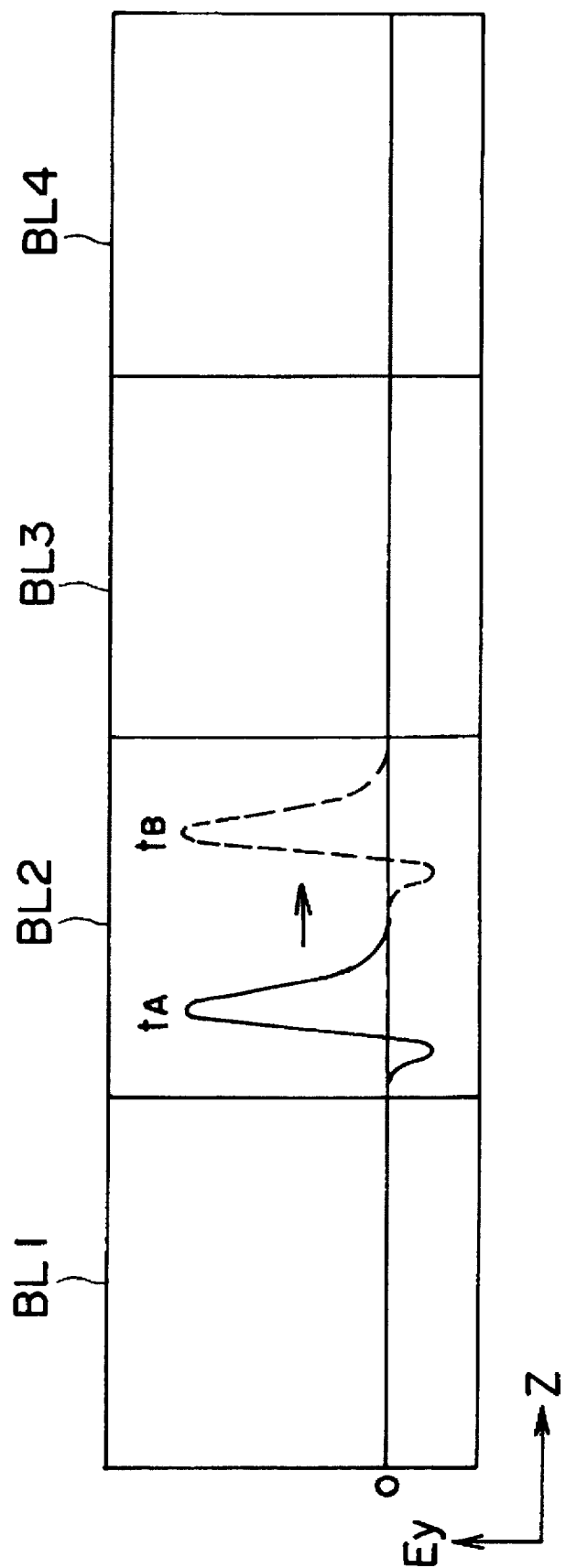

WAVE ANALYZING APPARATUS AND WAVE ANALYZING METHOD

BACKGROUND OF THE INVENTION

The present invention relates generally to a wave analyzing apparatus and a wave analyzing method of analyzing a transit behavior of wave data and, more particularly, to a wave analyzing apparatus and a wave analyzing method of analyzing the transit behavior of, e.g., electromagnetic wave data by use of an electronic computer.

In recent years, on the occasion of designing an electronic device, it has been practiced that a transit behavior thereof is simulated by use of a computer. Known are a variety of methods of simulating the transit behavior of the electromagnetic wave data. For example, according to a transmission line matrix method and a spatial circuit network method, it is assumed that a one-dimensional line exists between discrete points of a space, and a scatter matrix is defined at each lattice point. Then, wave propagation due to an occurrence of secondary waves is sequentially calculated. Further, according to a finite element time domain method, the space is divided into finite elements, and the thus divided finite elements are grasped as a question of minimum value of an electromagnetic wave energy in terms of a spatial aspect but differentiated in terms of a time aspect, wherein the wave propagation is sequentially calculated by a Maxwell equation method. Based on the finite difference time domain method, the space is discretized. Then, spatial and time differentiations are executed with respect to the individual discrete points, and the wave propagation is sequentially calculated by the Maxwell equation method.

Based on those methods, electromagnetic fields set at the spatial discrete points and physical quantities pursuant thereto are all calculated at intervals of a discrete time in accordance with the Maxwell equations. That is, according to those methods, though the space is discretized for the numerical calculation, no other approximation is conducted. Hence, the above methods are ranked as strict but high general-purpose methods among the numerical calculation methods for the electromagnetic wave behaviors.

On the occasion of performing the wave analysis by use of the above respective methods, however, the physical quantities relative to all the discrete points with the analysis space have hitherto been calculated per discrete time.

For instance, when applying pulse-like excitations to a micro strip line, as illustrated in FIGS. 19a–19d, an electromagnetic wave energy EN thereof is propagated along a Z-direction (micro strip line extending direction) in time series in a state of being distributed in a finite range.

FIGS. 20a–20d two-dimensionally illustrate the behaviors of the electromagnetic wave energy. Note that the axis of abscissa indicates a Z-directional position in FIGS. 19(a)–(d), while the axis of ordinate indicates a magnitude of a y-directional electric field at the center on the upper surface of the substrate formed with a micro strip line. As obvious from those Figures, at respective timings t1–t4, there is limited a range where an electric field Ey having a significant magnitude exists. For example, as shown in FIG. 20a, the electric field Ey exists only in the vicinity of a position Z1 at the timing t1, whereas the electric field having the significant magnitude does not exist in an area (right part in FIG. 20a) where Z is large. Further, as illustrated in FIG. 20d, the electric field Ey exists only in the vicinity of a position Z4 at the timing t4, whereas the electric field having the significant magnitude does not exist in an area (left part in FIG. 20d) where Z is small.

Namely, at the timing t1, there is no necessity for calculating the electromagnetic wave relative to the area where Z is large. There is also no necessity for calculating the electromagnetic wave relative to the area where Z is small at the timing t4. Thus, irrespective of the fact that the area where the calculation should be done differs depending on the calculation target timings, the calculation of the electromagnetic wave has hitherto been performed in the same procedures at all the timings. Therefore, a remarkably long calculation time is required till the data needed are to be obtained.

Further, the physical quantities about all the discrete points are calculated while being stored in the main storage device, and, hence, there is required the computer including the large-capacity main storage device.

SUMMARY OF THE INVENTION

It is a primary object of the present invention to provide a wave analyzing apparatus and a wave analyzing method that are capable of reducing a time necessary for a wave analysis.

It is another object of the present invention to provide a wave analyzing apparatus including a main storage device with a small storage capacity required for the wave analysis and a wave analyzing method.

A first wave analyzing apparatus according to the present invention analyzes, when changing wave data of a specified discrete point within an analysis domain expressed by a plurality of discrete points, such a state that the changes thereof are propagated in the form of spatial and time variations of wave data of other discrete points. The first wave analyzing apparatus comprises a storage unit, a dividing/managing unit, a determining unit and a analyzing unit.

The storage unit stores the wave data about each of the plurality of discrete points forming the analysis domain. The dividing/managing unit divides the analysis domain into a plurality of blocks and manages these blocks. The determining unit determines whether or not magnitudes of the wave data about some pre-designated discrete points for determination that are contained in an interior of the block are all smaller than a predetermined value for every block managed by the dividing/managing unit. Further, the analyzing unit treats, with respect to blocks in which the magnitudes of the wave data corresponding to the determination discrete points are determined to be smaller than the predetermined value by the determining unit, the wave data about the discrete points within these blocks, that have been stored in the storage unit as wave data about the discrete points after the fixed time has elapsed. Then, the analyzing unit calculates with respect to the blocks exclusive of the above-mentioned blocks, the wave data about the discrete points after a fixed time has elapsed on the basis of the wave data about the respective discrete points within these blocks, the wave data being stored in the storage unit.

That is, according to the first wave analyzing apparatus, the analysis domain is divided into some blocks, and whether or not the calculation of the wave data is required is determined based on a block basis in accordance with magnitudes of the wave data about the determination discrete points. Then, the wave data are actually calculated with respect to only the blocks requiring the calculation of the wave data. Therefore, in the first wave analyzing apparatus, when calculating the wave data at a certain timing, the calculations of some blocks within the analysis domain are to be omitted. As a result, a total calculation time is reduced.

It is to be noted that when constructing the first wave analyzing apparatus, and when calculating the wave data about the discrete points in the vicinity of a boundary of a certain block, it is desirable to adopt the analyzing unit using the wave data about the discrete points within other block contiguous to that boundary.

Further, in the case of constructing the first wave analyzing apparatus, there may be employed the determining unit performing the determinations about all the blocks managed by the dividing/managing unit at one time and the analyzing unit sequentially performing the analyses relative to all the blocks in which the determinations have been made. There may be also employed the determining unit effecting the determinations about the respective blocks managed by the dividing/managing unit and the analyzing unit performing, each time the determining unit makes the determination about a certain block, the analysis relative to this block.

A second wave analyzing apparatus according to the present invention analyzes, when changing wave data about a specified discrete point within an analysis domain expressed by a plurality of discrete points, such a state that the changes thereof are propagated in the form of spatial and time variations of wave data of other discrete points. The second wave analyzing apparatus comprises a dividing/managing unit, a main storage unit, an auxiliary storage unit, a calculating unit and an exchanging unit.

The dividing/managing unit divides the analysis domain into a plurality of blocks and manages these blocks. The main storage unit constructed of, e.g., a semiconductor memory stores the wave data about the discrete points for one block among the plurality of blocks. Further, the auxiliary storage unit constructed of, e.g., a magnetic disc device stores the wave data about the discrete points within the blocks the wave data of which are not stored in the main storage unit.

The calculating unit calculates the wave data about the discrete points within one block after a fixed time has elapsed, which wave data are stored in the main storage unit. The calculating unit then stores the main storage unit with the wave data defined as a result of the calculation. Subsequently, the exchanging unit exchanges the one-block wave data with which the calculating unit has stored the main storage unit for one-block wave data to be calculated next, which are stored in the auxiliary storage unit.

That is, in the second wave analyzing apparatus, the analysis domain is divided into some blocks, and the main storage unit is prepared with only the wave data about the discrete points within the calculation target blocks. Hence, according to the second wave analyzing apparatus, the main storage unit having a small storage capacity is capable of analyzing the behavior of the wave data within a large analysis domain.

It is possible to further add, to the second wave analyzing apparatus, a determining unit for determining whether or not magnitudes of the wave data about some pre-designated discrete points for determination that are contained in an interior of the block are all smaller than a predetermined value for every block managed by the dividing/managing unit. Incidentally, in this case, there is employed the calculating unit performing only the calculations relative to blocks in which the magnitudes of the wave data corresponding to the determination discrete points are determined to be smaller than the predetermined value by the determining unit.

In the case of constructing the second wave analyzing apparatus in this way, it follows that the wave data are actually calculated with respect to only the blocks requiring the wave data calculation. Hence, when calculating the wave data at a certain timing, the calculations of some blocks within the analysis domain are omitted, and, as a result, the total calculation time is reduced.

According to the present invention, there is provided a first wave analyzing method of analyzing, when changing wave data of a specified discrete point within an analysis domain expressed by a plurality of discrete points, such a state that the changes thereof are propagated in the form of spatial and time variations of wave data of other discrete points. The first wave analyzing method comprises a dividing step, a determining step and an analyzing step.

The dividing step involves dividing the analysis domain into a plurality of blocks. Further, the determining step involves determining whether or not magnitudes of the wave data about some pre-designated discrete points for determination that are contained in an interior of the block are all smaller than a predetermined value for every block divided in the dividing step. Then, the analyzing step involves treating, with respect to the blocks in which the magnitudes of the wave data corresponding to the determination discrete points are determined to be smaller than the predetermined value in the determining step, the wave data about the respective discrete points within these blocks as wave data about the discrete points after the fixed time has elapsed. The analyzing step also involves a process of calculating, with respect to the blocks exclusive of the above-mentioned blocks, the wave data about these discrete points after a fixed time has elapsed on the basis of the wave data about the respective discrete points within these blocks as wave.

Note that according to the first wave analyzing method, it is desirable to take the analyzing step which involves, in the case of calculating the wave data about the discrete points in the vicinity of a boundary of a certain block, using the wave data about the discrete points within other block contiguous to this boundary.

Further, the first wave analyzing method may adopt the determining step which involves performing the determinations about all the blocks divided in the dividing step at one time and the analyzing step which involves sequentially performing the analyses relative to all the blocks in which the determinations have been made. The first wave analyzing method may also adopt the determining step which involves individually effecting the determinations about the respective blocks divided in the dividing step and the analyzing step which involves performing, each time the determination about a certain block is made in the determining step, the analysis relative to this block.

According to the present invention, there is provided a second wave analyzing method, used for an electronic computer including a main storage unit and an auxiliary storage unit, of analyzing, when changing wave data of a specified discrete point within an analysis domain expressed by a plurality of discrete points, such a state that the changes thereof are propagated in the form of spatial and time variations of wave data of other discrete points. The second wave analyzing method comprises a dividing step, a writing step, a calculating step and an exchanging step.

The dividing step involves a process of dividing the analysis domain into a plurality of blocks. Further, the writing step involves a process of writing the wave data about the discrete points for one block among the plurality of blocks to the main storage unit and a process of writing the wave data about the discrete points within other blocks to the auxiliary storage unit.

The calculating step involves a process of calculating the wave data about the discrete points within one block after a fixed time has elapsed, which wave data are stored in the main storage unit, and a process of storing the main storage unit with the wave data defined as a result of the calculation. Then, the exchanging step involves a process of exchanging the one-block wave data stored in the main storage unit in the calculating step for one-block wave data to be calculated next, which are stored in the auxiliary storage unit.

That is, according to the second wave analyzing method, the analysis domain is divided into some blocks, and the main storage unit is prepared with only the wave data about the discrete points within the calculation target blocks. Hence, according to the second wave analyzing method, even the electronic computer including the main storage unit having a small storage capacity is capable of analyzing the behavior of the wave data in the large analysis domain.

It is feasible to further add, to the second wave analyzing method, a determining step of determining whether or not magnitudes of the wave data about some pre-designated discrete points for determination that are contained in an interior of the block are all smaller than a predetermined value for every block divided in the dividing step. Incidentally, in this case, the calculating step involves performing only the calculations relative to the blocks in which the magnitudes of the wave data corresponding to the determination discrete points are determined to be smaller than the predetermined value in the determining step.

According to the second wave analyzing method, when calculating the wave data at a certain timing, the calculations of some blocks within the analysis domain are to be omitted, and hence the total calculation time is reduced.

BRIEF DESCRIPTION OF THE DRAWINGS

Other objects and advantages of the present invention will become apparent during the following discussion in conjunction with the accompanying drawings, in which:

FIG. 6 is a chart showing contents of an analysis domain table;

FIG. 9 is a diagram exemplifying a case where an electromagnetic wave propagating along the strip line exists in only one block;

DESCRIPTION OF THE PREFERRED EMBODIMENTS

A wave analyzing apparatus and a wave analyzing method according to the present invention will hereinafter be specifically described with reference to the accompanying drawings.

Figure 1:
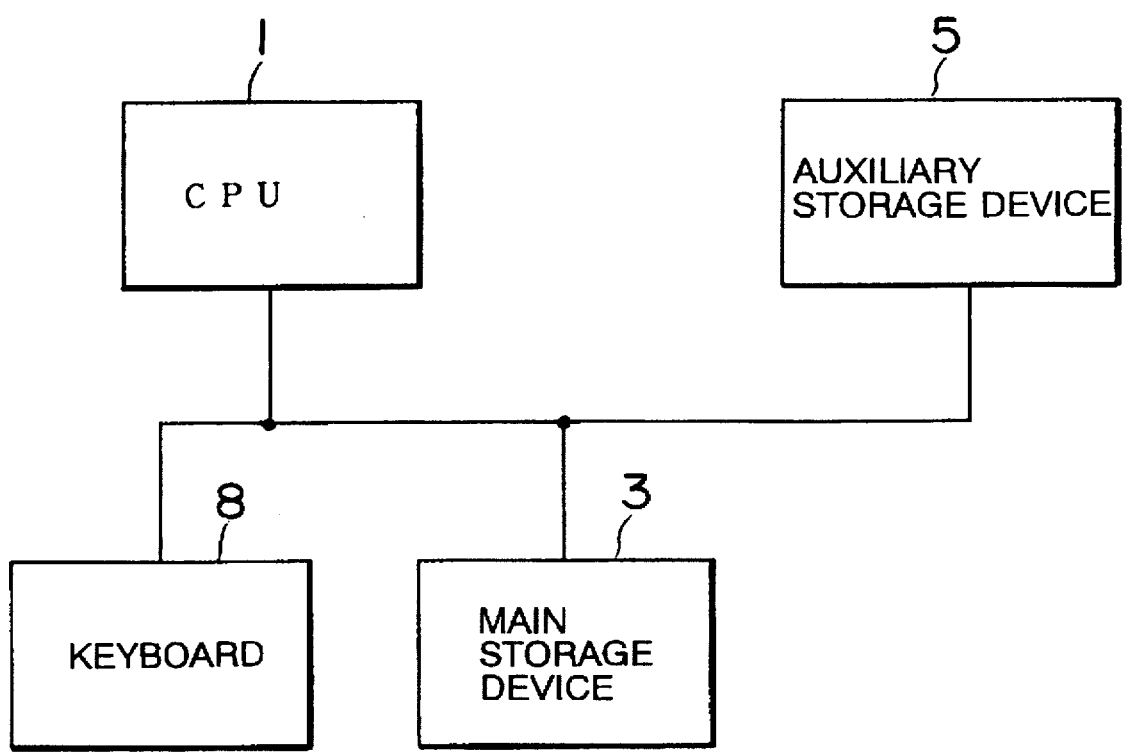
FIG. 1 is a block diagram illustrating a construction of a wave analyzing apparatus in one embodiment of the present invention.

FIG. 1 schematically illustrates a construction of a wave analyzing apparatus in one embodiment of the present invention.

As shown in FIG. 1, the wave analyzing apparatus includes a CPU 1, a main storage device 3, an auxiliary storage device 5 and a keyboard 8 as main constructive elements. In the present wave analyzing apparatus, the main storage device 3 involves the use of a semiconductor memory, while the auxiliary storage device 5 involves the use of a hard disk device. The main storage device 3 is stored with a program for determining operating procedures of the CPU 1. The CPU 1 obtains various items of data from the keyboard 8 in accordance with that program. Then, the CPU 1 integrally controls the main storage device 3 and the auxiliary storage device 5, thus executing a wave analysis on the basis of the obtained data.

The operating procedures of the present wave analyzing apparatus will be specifically explained.

Figure 2:
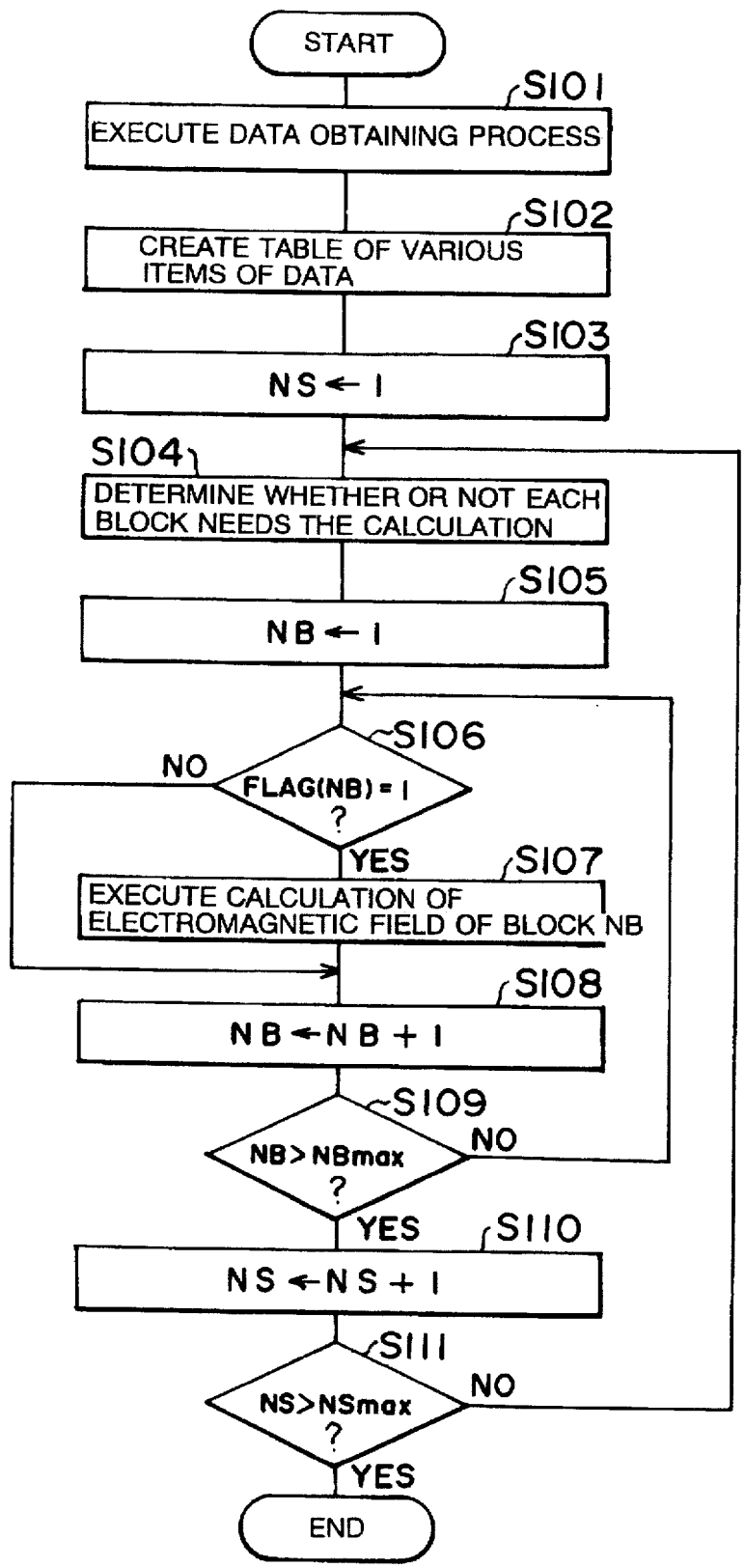
FIG. 2 is a flowchart showing electromagnetic wave analyzing procedures by the wave analyzing apparatus in the embodiment.

FIG. 2 shows a flow of operation of the wave analyzing apparatus (CPU) in the embodiment. As shown in FIG. 2, when the present wave analyzing apparatus is started up, at first, a data obtaining process (step S101) is executed.

Figure 3:
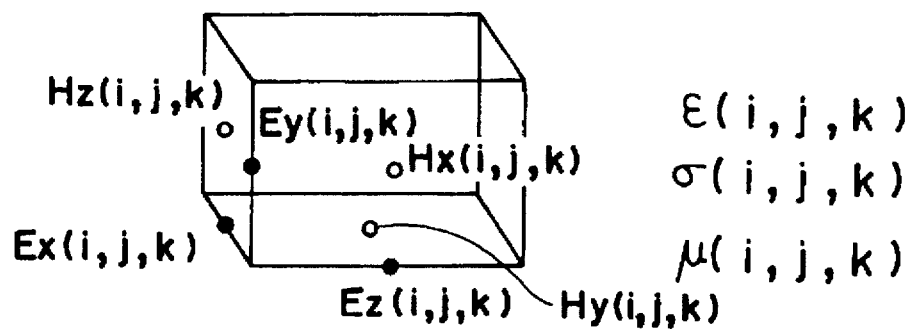
FIG. 3 is a view illustrating a discrete lattice allocated to an analysis space.

The present apparatus is constructed to perform the wave analysis by use of a finite difference time domain method, and hence an analysis space is treated as an assemblage of discrete lattices as schematically illustrated in FIG. 3. As illustrated in FIG. 3, the discrete lattices are constructed of six discrete points (indicated by white and black circles) to which electromagnetic field components Ex, Ey, Ez, Hx, Hy, Hz are respectively allocated. Then, a dielectric factor ε(i, j, k), a permeability μ(i, j, k) and an electric conductivity σ(i, j, k) corresponding to positions within the analysis space of the discrete lattices correspond to the individual discrete points.

In the present apparatus, the analysis domain is thus discretized, thereby differentiating a Maxwell equation in a rectangular coordinate system which follows. Thus, spatial and time variations in electromagnetic wave data at all the discrete points contained in a block are calculated.

$$-\mu \frac{\partial H}{\partial t} = rotE \quad (1)$$

$$\epsilon \frac{\partial E}{\partial t} + \sigma E = rotH \quad (2)$$

Hence, the CPU obtains data needed for the calculation by the normal finite difference time domain method and data peculiar to the present apparatus in step S101.

The former data include spatial discrete intervals dx, dy, dz defined as intervals in respective directions X, Y, Z of the discrete lattices, numbers-of-spatial-discrete-lattices NX, NY, NZ defined as the numbers of the discrete lattices in the respective directions X, Y, Z and data for making the dielectric factor ε, the permeability μ and the electric conductivity σ relative to substances existing in positions of discrete lattices B (i, j, k) (i=1 to NX, j=1 to NY, k=1 to NZ) corresponding to these respective discrete lattices B. The CPU obtains these items of data from the analyzer in step S101.

Figure 4:
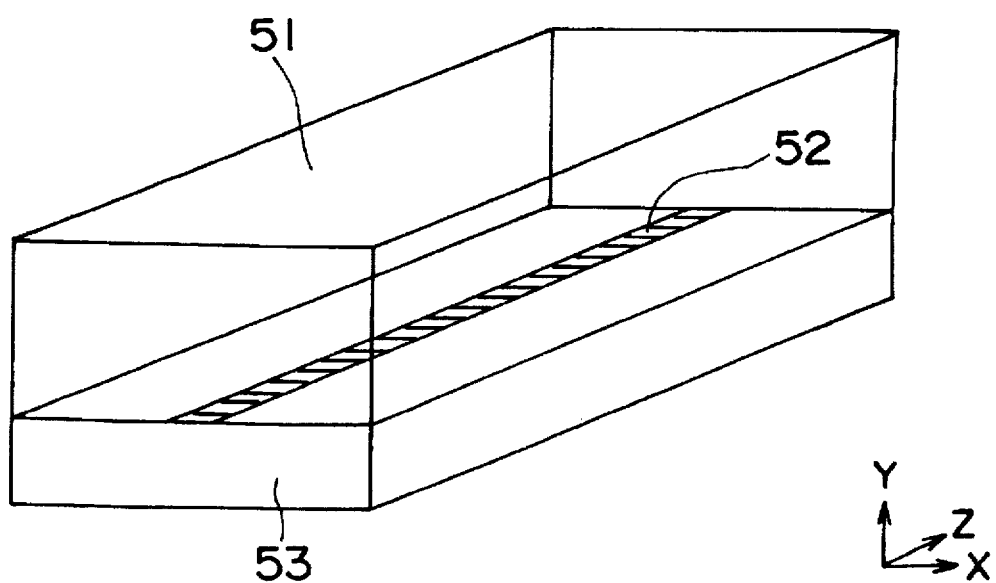
FIG. 4 is a view illustrating the analysis space set when analyzing a micro strip line.

For example, when analyzing an electromagnetic wave propagated along a strip line formed on a substrate, the analyzer, as schematically illustrated in FIG. 4, assumes an analysis domain formed with a spatial area 51 above a substrate 53 formed with a strip line 52, sets the discrete lattices within this analysis domain and causes the wave analyzing apparatus to execute the wave analysis.

Further, the analyzer inputs boundary condition data about an electric wall boundary, a magnetic wall boundary and an absorption boundary, which boundary condition data serve to determine how the boundaries in the analysis domain are dealt with. The analyzer also inputs excitation data about excitation points and excitation waveforms and a number-of-time-calculation-repetitions NSmax. The boundary condition data and the excitation data are the same as those used for a normal analysis, and hence explanations thereof will be omitted.

Inputted together with the above normal data in step S101 are determining condition data and block dividing condition data that are peculiar to the present apparatus.

The determining condition data serve to designate the data used for determining whether the calculation is required or not. The analyzer designates a series of discrete points (hereinafter expressed as determination discrete points) exhibiting the maximum variation in the electric field component on the basis of the determining condition data. The block dividing condition data serve to designate how the analysis domain is divided into a plurality of blocks. The analyzer provides the wave analyzing apparatus with the block dividing condition data normally consisting of dividing directions and the number of divisions.

For instance, it is assumed that when respectively setting dx, dy, dz to 1.0, 0.8, 2.0 and NX, NY, NZ to 50, 70, 400 with respect to the analysis space shown in FIG. 4, the strip line 52 exists in such a position that the center is set by a Y-directional discrete coordinate j of 20 and an X-directional discrete coordinate i of 26.

Figures 5, 8:
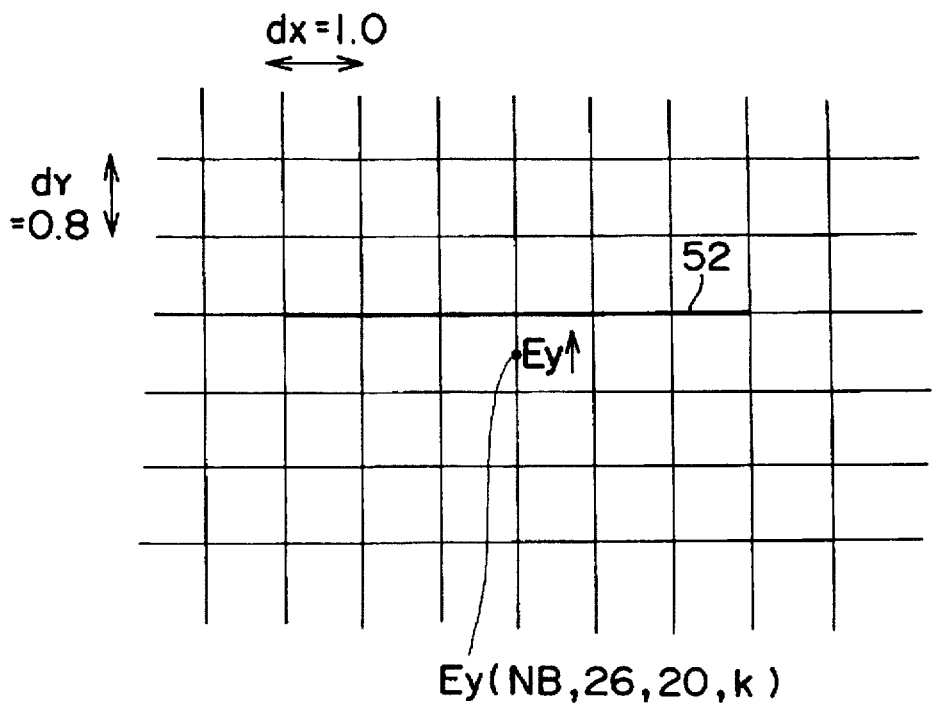
FIG. 5 is a diagram showing a positional relationship between the strip line and a discrete point for determination.
FIG. 8 is a chart showing contents of a determination table.

In this case, the analyzer, as schematically illustrated in FIG. 5, designates that a Y-directional electric field component Ey just under the micro strip line 52 is used on the basis of the determining condition data. Further, the analyzer gives an indication to divide the analysis domain into the blocks in such a form as to be orthogonal to a signal propagating direction on the basis of the block dividing condition data. That is, the analyzer gives the indication to divide the analysis domain shown in FIG. 4 in the Z-direction.

When obtaining the series of data described above in step S101, the CPU creates a table of various items of data corresponding to the inputted data (step S102).

For example, when supplied with the block dividing condition data for indicating that the analysis are is divided by 4 in the Z-direction together with the determining condition data for indicating that the Y-directional electric field component Ey just under the micro strip line 52 is used, the CPU creates an analysis domain table as shown in FIG. 6.

As shown in FIG. 6, the analysis domain table is stored with a calculation required/non-required flag FLG(n), a number-of-spatial-discrete-lattices NX(n), NY(n), NZ(n), spatial discrete intervals dx(n), dy(n), dz(n) and fiducial lattice coordinates BI(n), BJ(n), BK(n) with respect to four individual blocks BLn (n=1 through 4). Among those items of data, the number of spatial discrete lattices is the number of discrete lattices contained in each block. If divided by 4 in the Z-direction, as depicted in the Figure, the number of spatial discrete lattices in each block takes the same value. The fiducial lattice coordinate is coordinate data of the fiducial discrete lattice in each block, and, in the present apparatus, the discrete lattice with the minimum I-, J- and K-values (discrete coordinate values) is employed as a fiducial lattice. Therefore, when divided by 4 in the Z-direction, there are stored the fiducial lattice data wherein only Z-directional coordinates BK(n) are different by one hundreds. The calculation required/non-required flag will be mentioned later in greater detail.

Figure 7:
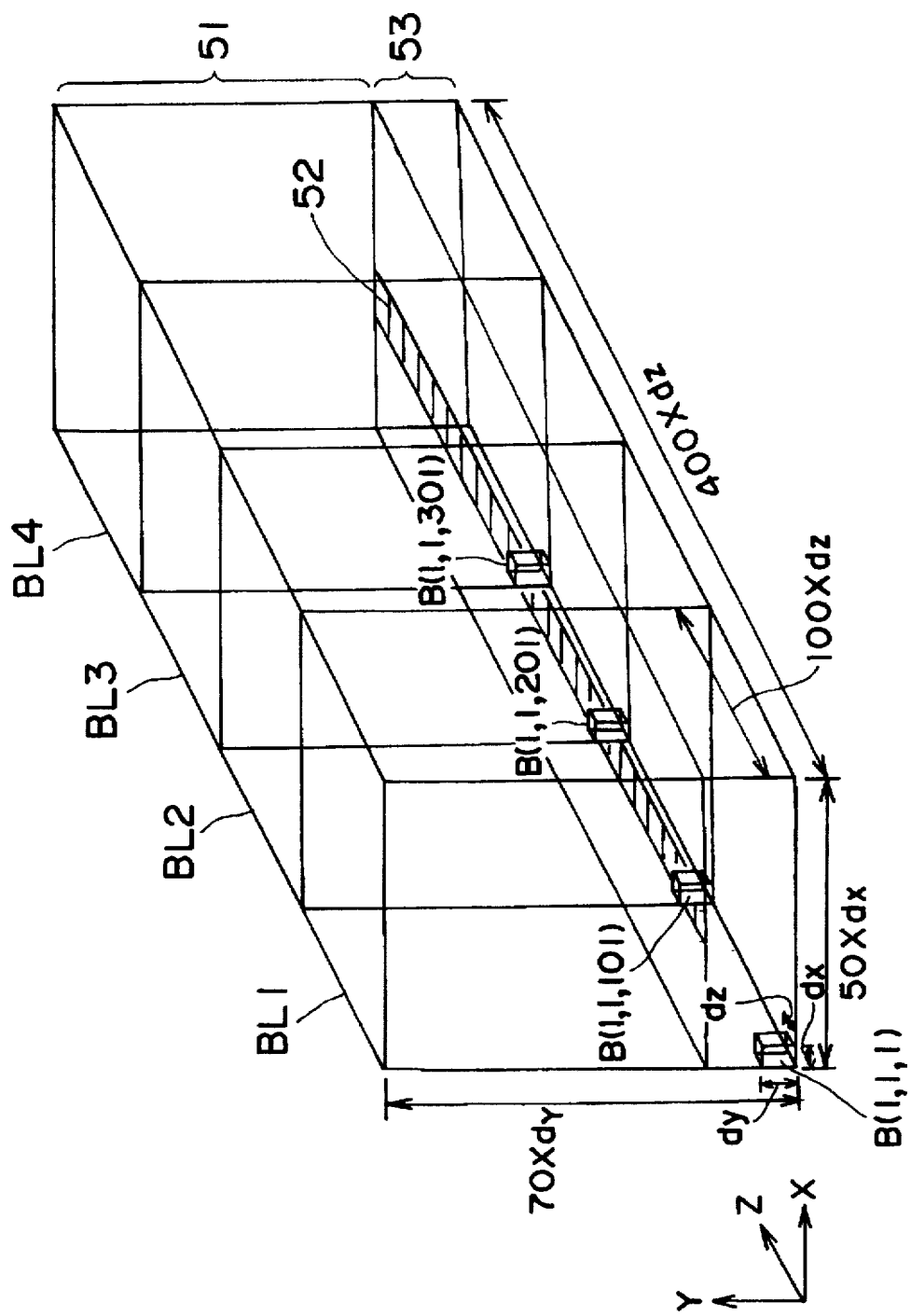
FIG. 7 is a view showing a relationship between the analysis space and blocks.

The CPU hereinafter deals with the analysis domain as a set of four blocks as schematically illustrated in FIG. 7 in accordance with contents of the analysis domain table.

Further, the CPU creates a determination table for storing the electric field component Ey relative to the determination discrete points on the basis of the given determining condition data. FIG. 8 shows an outline of the determination table. As shown in FIG. 8, the determination table is formed with areas for storing the electric field component relative to some determination discrete points for every block. This determination table is created on the main storage device 3, and contents thereof are updated when performing the calculation relative to the determination discrete point during an electromagnetic wave calculation process which will be hereinbelow stated. Note that in Ey (NB, i, j, k) in the Figure represents a Y-directional electric field component at the discrete point positioned at a coordinate (i, j, k) in the coordinate system, wherein the fiducial lattice serves as an origin within the block NB.

The CPU, after creating the above table, sets "0" in a variable NS for storing the value of the number-of-time-calculation-repetitions (step S103). Determined subsequently is whether or not each block needs the calculation. The calculation required/non-required flag relative to the block requiring the calculation is set to "1", while the calculation required/non-required flag relative to the block requiring no calculation is set to "0" (step S104). In this step, the electric fields Ey of the respective discrete lattices, which are stored in the determination table are compared with a predetermined value $\eta$(e.g., $10^{-10}$) in terms of magnitudes thereof with respect to a target block. If there exists the electric field Ey over the predetermined value $\eta$, it is judged that the calculation is needed.

For example, the determination data of a block BL1 are composed of 102 pieces of data such as Ey (1, 26, 20, k) (k=1 to 100), Ey (2, 26, 20, k) (k=1 to 2), and therefore, in step S103, "1" is set in the flag FLG(1) if even only one piece of data larger than the predetermined value $\eta$ exists in those items of data. Whereas if all those pieces of data are smaller than the predetermined value $\eta$, "0" is set in the flag FLG(1).

Further, the determination data of a block BL2 are Ey (1, 26, 20, k) (k=99, 100) of the block BL1, Ey (2, 26, 20, k) (k=1 through 100) of the block BL2 and Ey (3, 26, 20, k) (k=1, 2) of the block BL3. Hence, "1" is set in the flag FLG(2) if even only one piece of data larger than the predetermined value $\eta$ exists in those items of data. Whereas if all those pieces of data are smaller than the predetermined value $\eta$, "0" is set in the flag FLG(2).

Similarly, with respect to the blocks BL3, BL4 also, the magnitudes of each item of determination data and of the predetermined value $\eta$ are compared with each other, and "0" or "1" is set in the flags FLG(3), FLG(4).

Subsequently, the CPU sets "1" in the variable NB for specifying the target block (step S105) and, only if FLAG (NB) is "1" (step S106; Y), performs the electromagnetic field calculation with respect to that block (step S107), thus obtaining the electromagnetic wave data after a fixed time has elapsed. Further, if FLAG(NB) is "0", the electromagnetic wave data relative to that block are set intactly as the electromagnetic wave data after the fixed time has elapsed.

Then, NB is incremented by "1" (step S108), and consequently, if NB is smaller than a total-number-of-blocks NBmax (step S109; Y), the processing returns to step S106. Whereas if NB is larger than NBmax (step S109; N) "1" is added to NS (step S110). If NS does not exceed NSmax (step S111; N), the processing goes back to step S104.

Thus, in the present wave analyzing apparatus, there are omitted the electromagnetic field calculations about the blocks in which the electromagnetic wave data relative to all the determination discrete points are smaller than the predetermined value. Hence, for example, when one edge of the strip line receives an excitation (i.e., a pulse excitation) in which a width of a waveform of the electromagnetic wave and a spread of the waveform due to a dispersion are sufficiently small as compared with a size of the block, it follows that a calculation time is remarkably reduced.

That is, the above-described case will probably include a case where the electromagnetic wave propagated along the strip line exists in only one block and a case where the electromagnetic wave exists extending to two blocks adjacent to each other. For instance, as schematically illustrated in FIG. 9, during a $|t_A-t_B|$ period for which an electromagnetic wave energy exists in only the block BL2, it follows that the electromagnetic wave data calculations with respect to the blocks BL1, BL3, BL4 are omitted.

Figure 10:
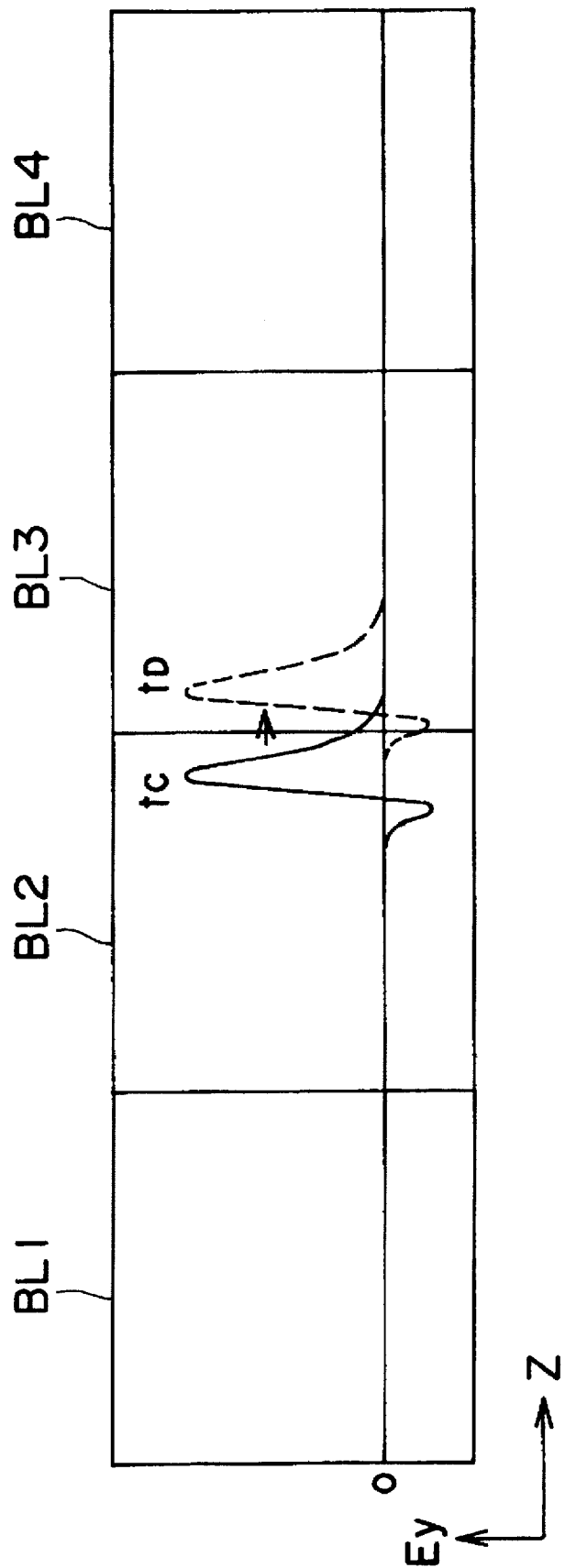
FIG. 10 is a diagram exemplifying a case where the electromagnetic wave propagating along the strip line exists extending to two blocks.

Further, as schematically illustrated in FIG. 10, during a $|t_C-t_D|$ period for which the electromagnetic energy exists extending to the blocks BL2, BL3, there are carried out only the calculations relative to the blocks BL2, BL3, while the calculations about two other blocks are to be omitted.

Note that the number of determination discrete points used for determining whether the calculation of the electromagnetic wave data is needed or not can be made considerably smaller than the number of discrete points to be calculated, and hence the time required for the determination is short enough to exert almost no influence on the total calculation time.

<Transferring and Receiving of Data between Storage Devices>

In the present magnetic field analyzing apparatus, when starting and completing the electromagnetic field calculation of a certain block, the data are transferred and received between the main storage device 3 and the auxiliary storage device 5.

Hereinafter, the data transferring/receiving procedures will be specifically explained with reference to FIGS. 12 through 18. In the respective Figures, a symbol with BDn(t) shown in the interior thereof represents the electromagnetic wave data at a timing (t) about the discrete lattice contained in the block BLn. Further, a symbol with SDn.m(t) shown therein represents the electromagnetic wave data at the timing (t) about the discrete lattice contiguous to a connecting surface with the block BLm among the discrete lattices contained in the blocks BLn. Note that the explanation will be given on the assumption that the calculation required/ non-required flags about all the blocks are "1".

Figure 11:
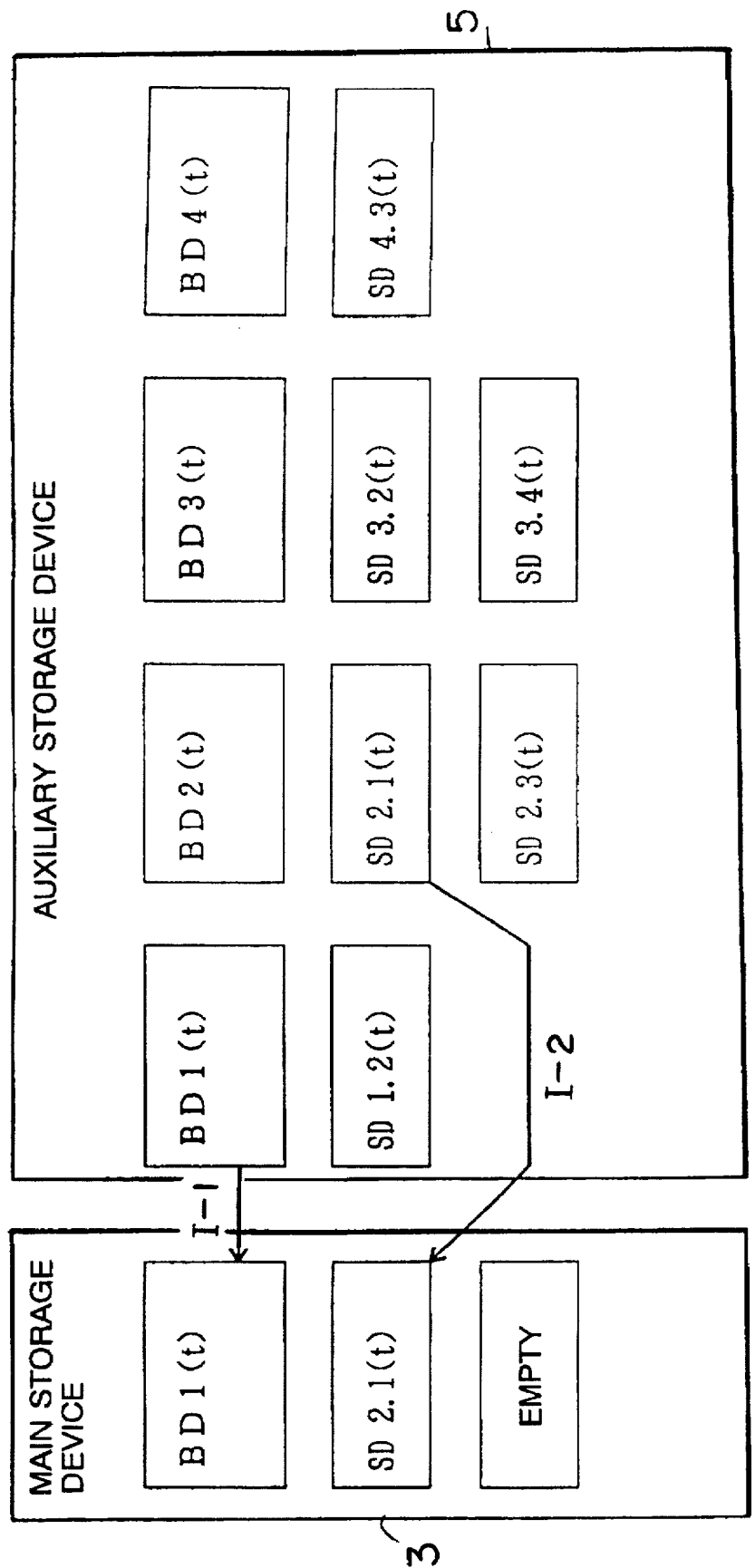
FIG. 11 is an explanatory diagram schematically showing a procedure for writing electromagnetic wave data of a block BL1 at a timing (t) to a main storage device.

When starting the electromagnetic field calculation relative to the block BL1 at a timing "t+dt", as schematically shown in FIG. 11, the electromagnetic wave data BD1(t) of the block BL1 at the timing (t) is read from the auxiliary storage device 5 and written to the main storage device 3 (I-1). Further, the electromagnetic wave data SD2.1(t) of the block BL2 at the timing (t) about the discrete lattice contiguous to the surface on the side of the block BL1 is also read from the auxiliary storage device 5 and written to the main storage device 3 (I-2).

Thereafter, the electromagnetic wave data BD1(t+dt) of the block BL1 at a time (t+dt) is calculated by use of the electromagnetic wave data BD1(t), SD2.1(t) stored in the main storage device 3. When completing the calculations for one block, the data BD(t+dt) and the data SD2.1(t) are stored in the main storage device 3.

Figure 12:
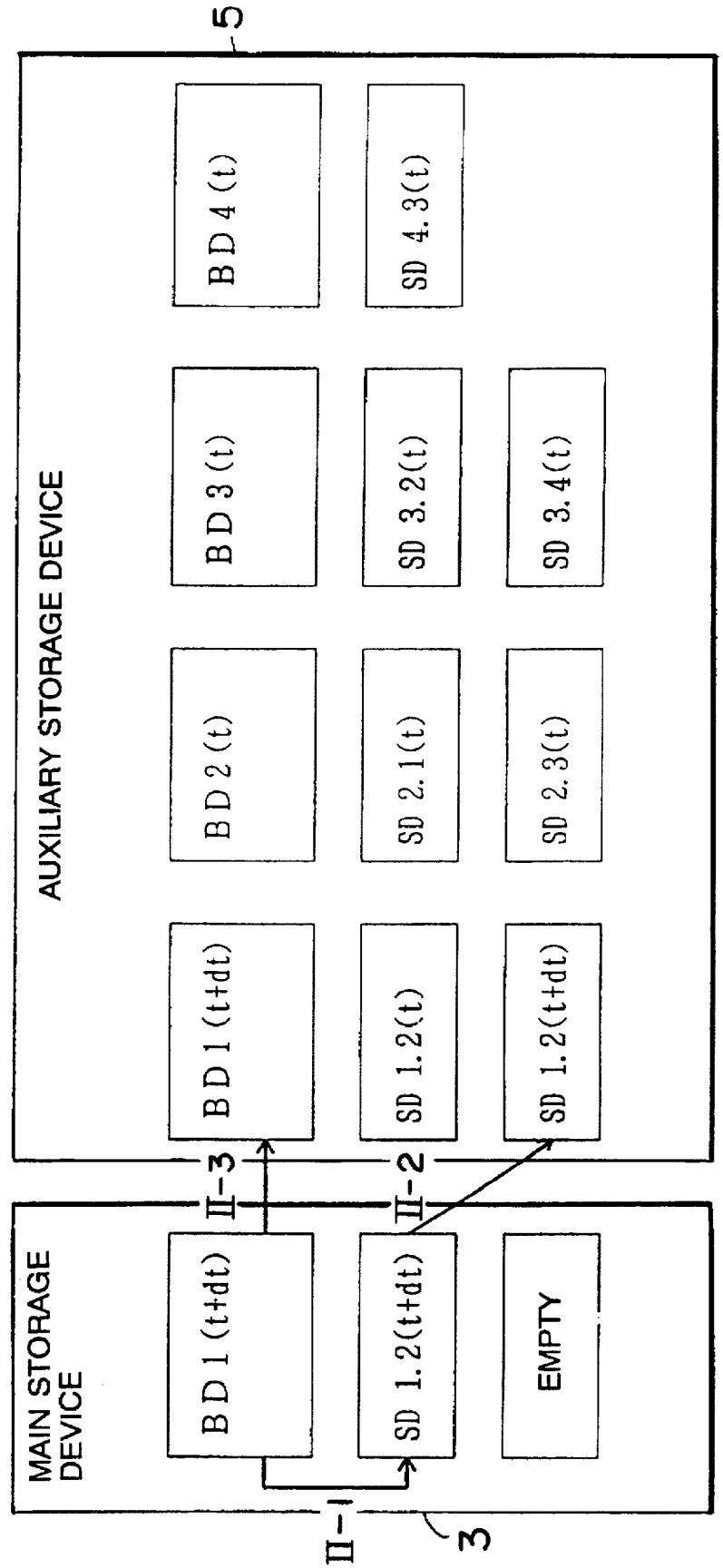
FIG. 12 is an explanatory diagram schematically showing a procedure for writing the electromagnetic wave data of the block BL1 at a timing (t+dt) to an auxiliary storage device.

At this stage, the CPU, as schematically shown in FIG. 12, extracts the electromagnetic wave data SD1.2(t+dt) about the discrete lattice contiguous to the surface on the side of the block BL2 from the electromagnetic data BD1(t+dt) (II-1), and the thus extracted data is stored in the auxiliary storage device 5 (II-2). Further, the CPU overwrites BD(t) in the auxiliary storage device 5 with the electromagnetic data BD1(t+dt) (II-3).

Figure 13:
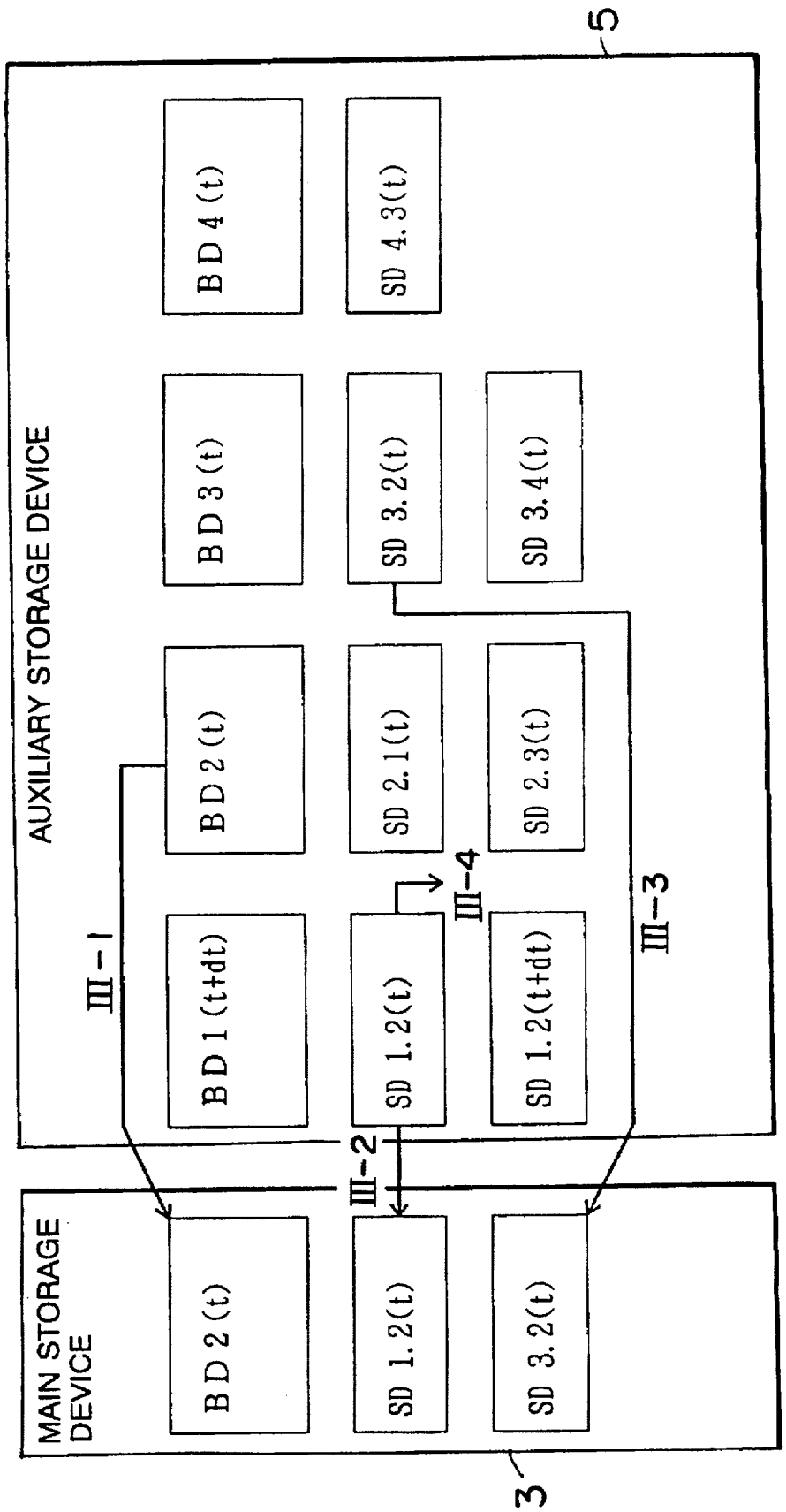
FIG. 13 is an explanatory diagram schematically showing a procedure for writing the electromagnetic wave data of a block BL2 at the timing (t) to the main storage device.

Next, as illustrated in FIG. 13, the CPU reads the electromagnetic wave data BD2(t) of the block BL2 at the timing (t) from the auxiliary storage device 5 and writes it to the main storage device 3 (III-1). Also, the CPU reads, from the auxiliary storage device 5, the electromagnetic wave data SD1.2(t) of the block BL1 on the discrete lattice contiguous to the surface on the side of the block BL2 at the timing (t) and the electromagnetic wave data SD3.2(t) of the block BL3 on the discrete lattice contiguous to the surface on the side of the block BL2 and writes the thus read data to main storage device 3 (III-2, III-3). Further, the CPU erases the electromagnetic wave data SD1.2(t) of the block BL1 at the timing (t) on the discrete lattice contiguous to the surface on the side of the block BL2 (III-4).

Then, the CPU obtains the electromagnetic wave data BD2(t+dt) by use of the electromagnetic wave data BD2(t), SD1.2(t), SD3.2(t).

Figure 14:
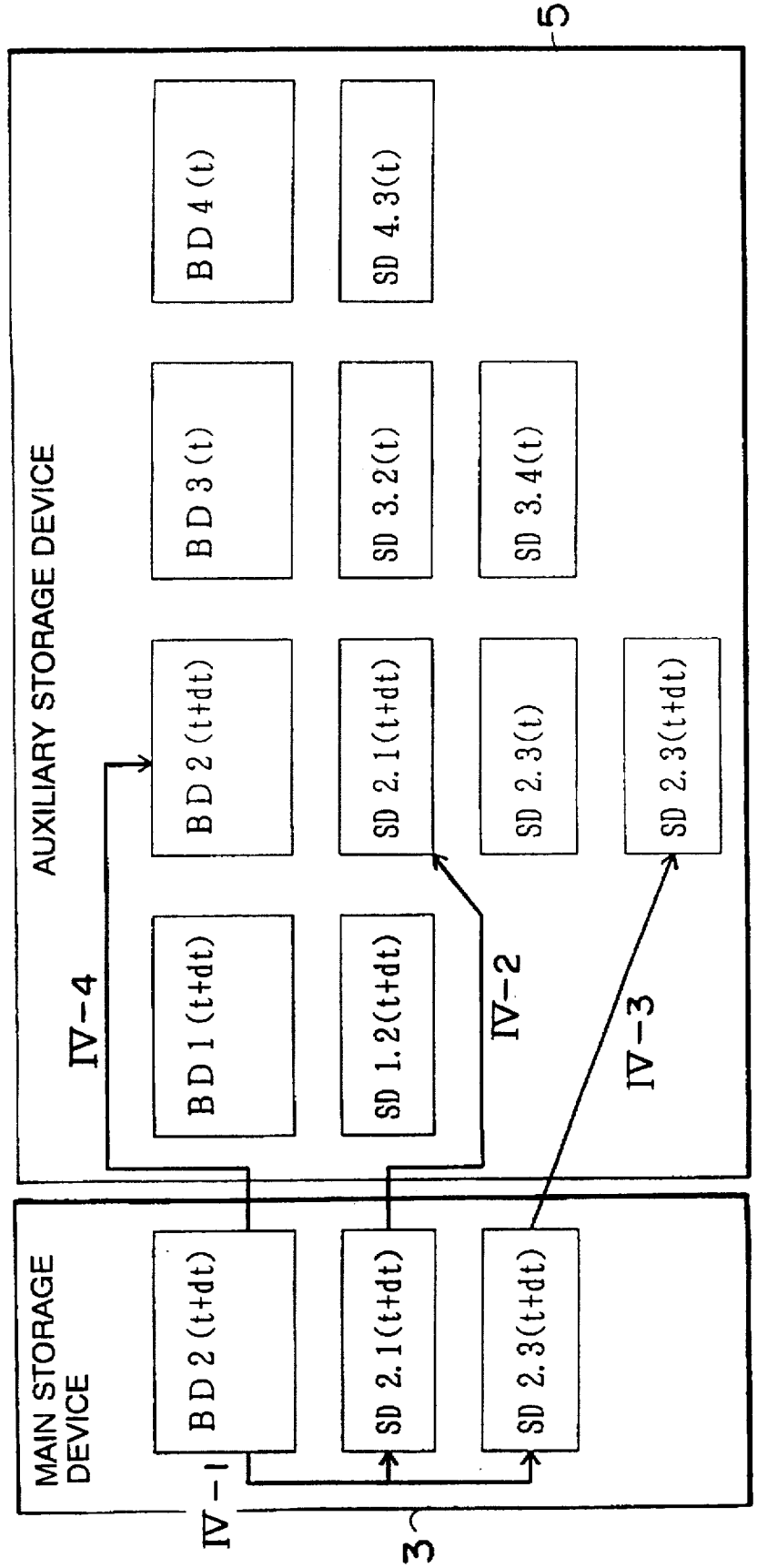
FIG. 14 is an explanatory diagram schematically showing a procedure for writing the electromagnetic wave data of the block BL2 at the timing (t+dt) to the auxiliary storage device.

Subsequently, the CPU, as shown in FIG. 14, extracts the electromagnetic wave data SD2.1(t+dt) on the discrete lattice contiguous to the surface on the side of the block BL1 and the electromagnetic wave data SD2.3(t+dt) on the discrete lattice contiguous to the surface on the side of the block BL3 from the electromagnetic wave data BD2(t+dt) (IV-1). The CPU then stores the auxiliary storage device 5 with the two items of extracted data (IV-2, IV-3). On this occasion, the electromagnetic wave data SD2.1(t+dt) is stored therein while erasing (overwriting) the electromagnetic wave data SD2.1(t) (IV-2). However, the electromagnetic wave data SD2.3(t+dt) is stored in such a form that the electromagnetic wave data SD2.3(t) is not erased. Further, the CPU overwrites the electromagnetic wave data BD2(t) in the auxiliary storage device 5 with the electromagnetic wave data BD2(t+dt) in the main storage device 3 (IV-4).

Figure 15:
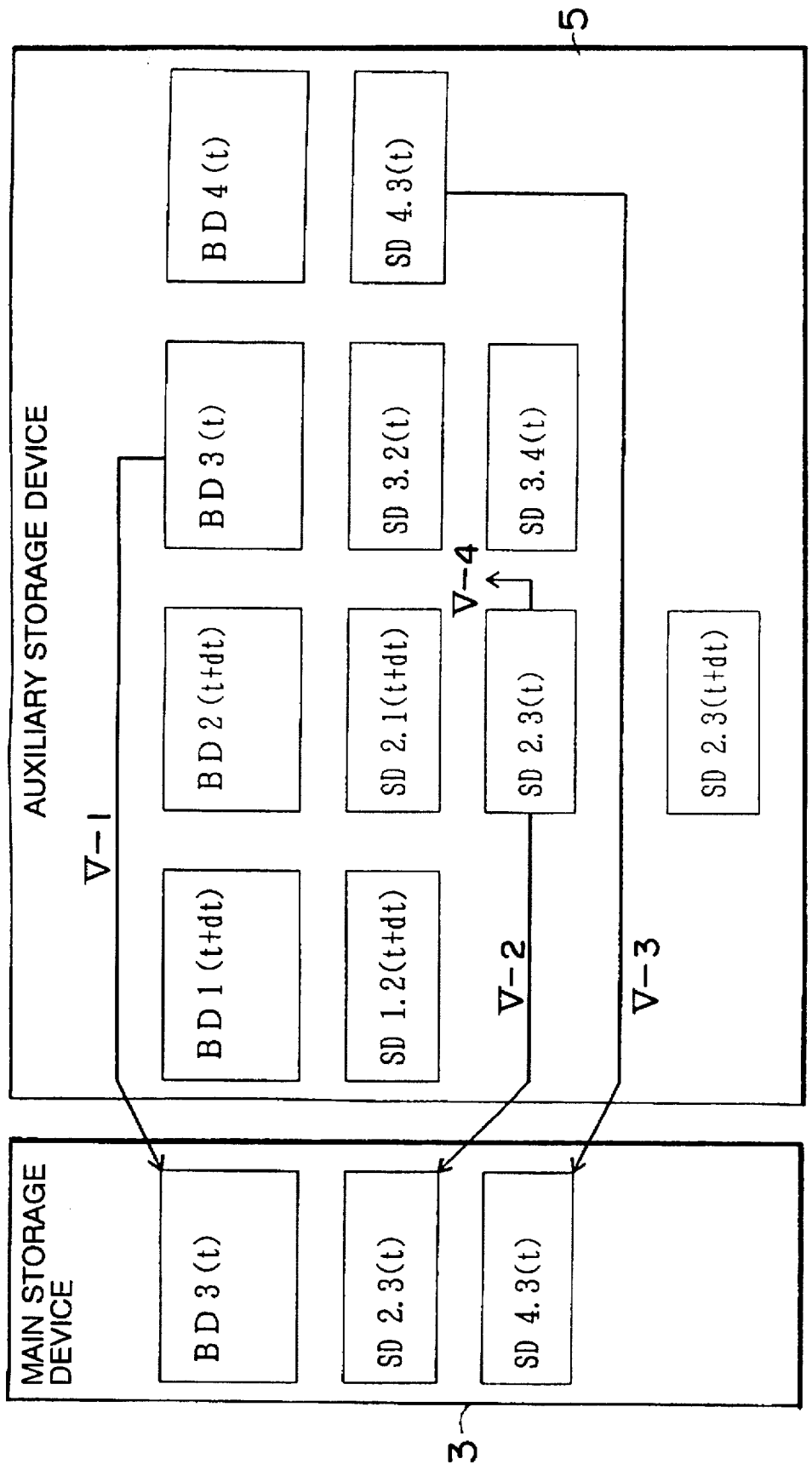
FIG. 15 is an explanatory diagram schematically showing a procedure for writing the electromagnetic wave data of a block BL3 at the timing (t) to the main storage device.

Next, as illustrated in FIG. 15, the CPU reads the electromagnetic wave data BD3(t) of the block BL3 at the timing (t) from the auxiliary storage device 5 and writes it to the main storage device 3 (V-1). Further, the CPU reads the electromagnetic wave data SD2.3(t) of the block BL2 on the discrete lattice contiguous to the surface on the side of the block BL3 and the electromagnetic wave data SD4.3(t) of the block BL4 on the discrete lattice contiguous to the surface on the side of the block BL3 from the auxiliary storage device 5 and writes the thus read data to the main storage device 3 (V-2, V-3).

Also, the CPU erases the electromagnetic wave data SD2.3(t) of the block BL2 at the timing (t) on the discrete lattice contiguous to the surface on the side of the block BL3 from the main storage device 3 (V-4).

Then, the CPU obtains the electromagnetic wave data BD3(t+dt) by use of the electromagnetic wave data BD3(t), SD2.3(t) and SD4.3(t) stored in the main storage device 3.

Figure 16:
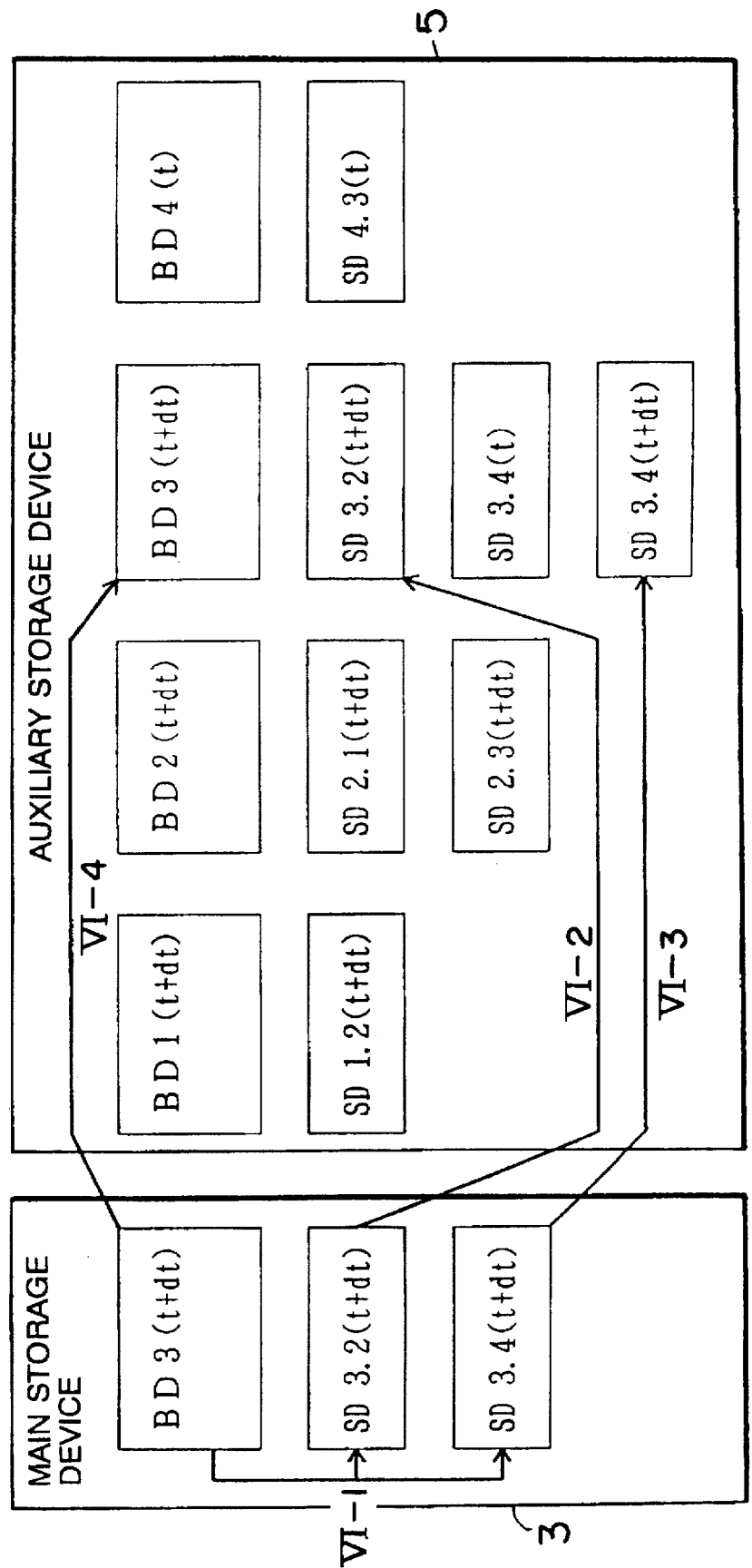
FIG. 16 is an explanatory diagram schematically showing a procedure for writing the electromagnetic wave data of the block BL3 at the timing (t+dt) to the auxiliary storage device.

After completing the calculation of the electromagnetic wave data BD3(t+dt), the CPU, as shown in FIG. 16, extracts the electromagnetic wave data SD3.2(t+dt) on the discrete lattice contiguous to the surface on the side of the block BL1 and the electromagnetic wave data SD3.4(t+dt) on the discrete lattice contiguous to the surface on the side of the block BL3 from the electromagnetic wave data BD3(t+dt) (VI-1). The CPU then stores the auxiliary storage device 5 with the two items of extracted data (VI-2. VI-3). On this occasion, the electromagnetic wave data SD3.2(t+dt) is stored therein while overwriting the electromagnetic wave data SD3.2(t) (VI-2). However, the electromagnetic wave data SD3.4(t+dt) is stored in such a form that the electromagnetic wave data SD3.4(t) is not erased. Further, the CPU overwrites the electromagnetic wave data BD3(t) in the auxiliary storage device 5 with the electromagnetic wave data BD3(t+dt) in the main storage device 3 (VI-4).

Figure 17:
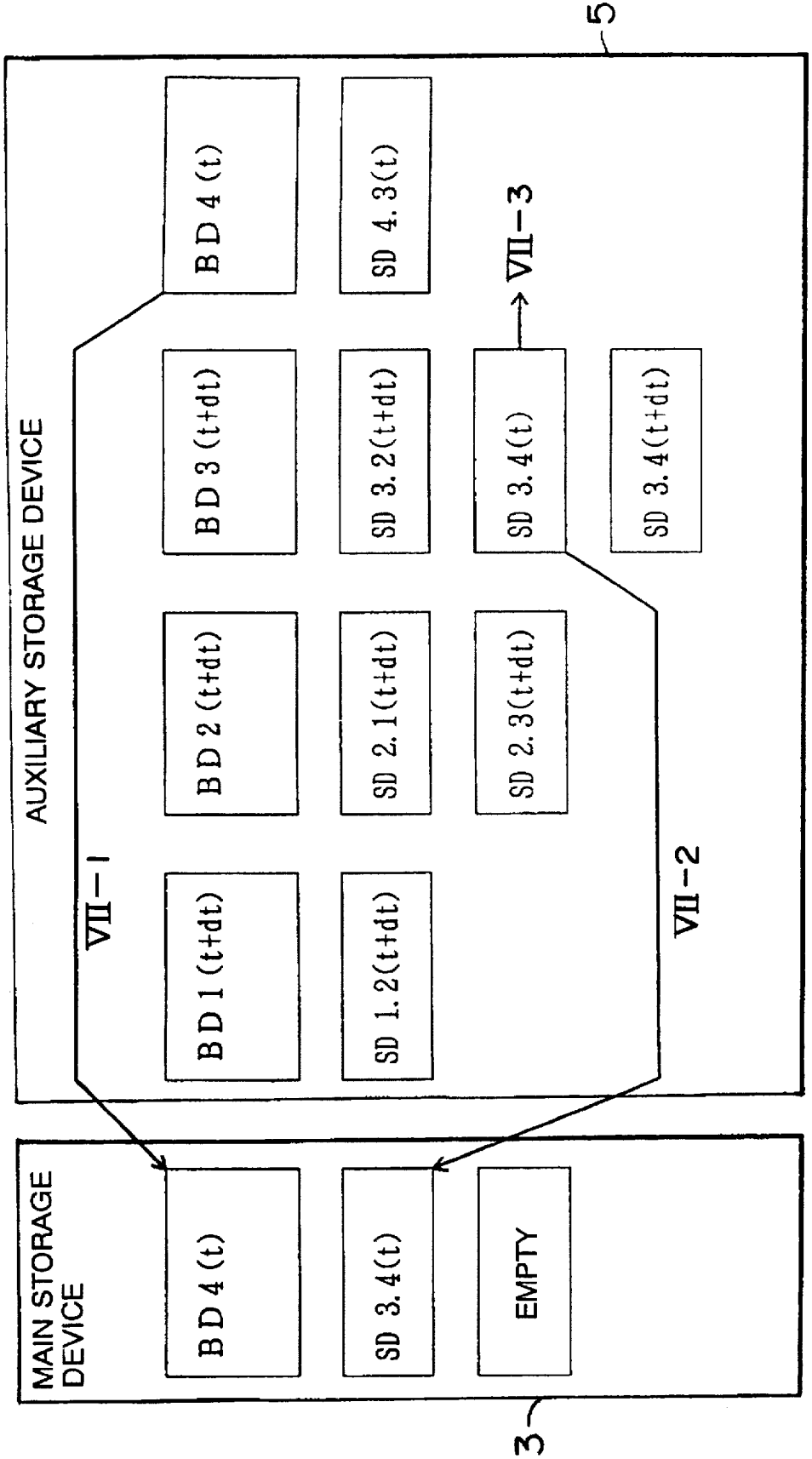
FIG. 17 is an explanatory diagram schematically showing a procedure for writing the electromagnetic wave data of a block BL4 at the timing (t) to the main storage device.

Next, as illustrated in FIG. 17, the CPU reads the electromagnetic wave data BD4(t) from the auxiliary storage device 5 and writes it to the main storage device 3 (VII-1). Further, the CPU reads the electromagnetic wave data SD3.4(t) of the block BL3 at the timing (t) on the discrete lattice contiguous to the surface on the side of the block BL4 from the auxiliary storage device 5 and writes the thus read data to the main storage device 3 (VII-2). The CPU then erases the electromagnetic wave data SD3.4(t) from the auxiliary storage device 5 (VII-3).

Then, the CPU calculates the electromagnetic wave data BD4(t+dt) by use of the electromagnetic wave data BD4(t), SD3.4(t) existing on the main storage device 3.

Figure 18:
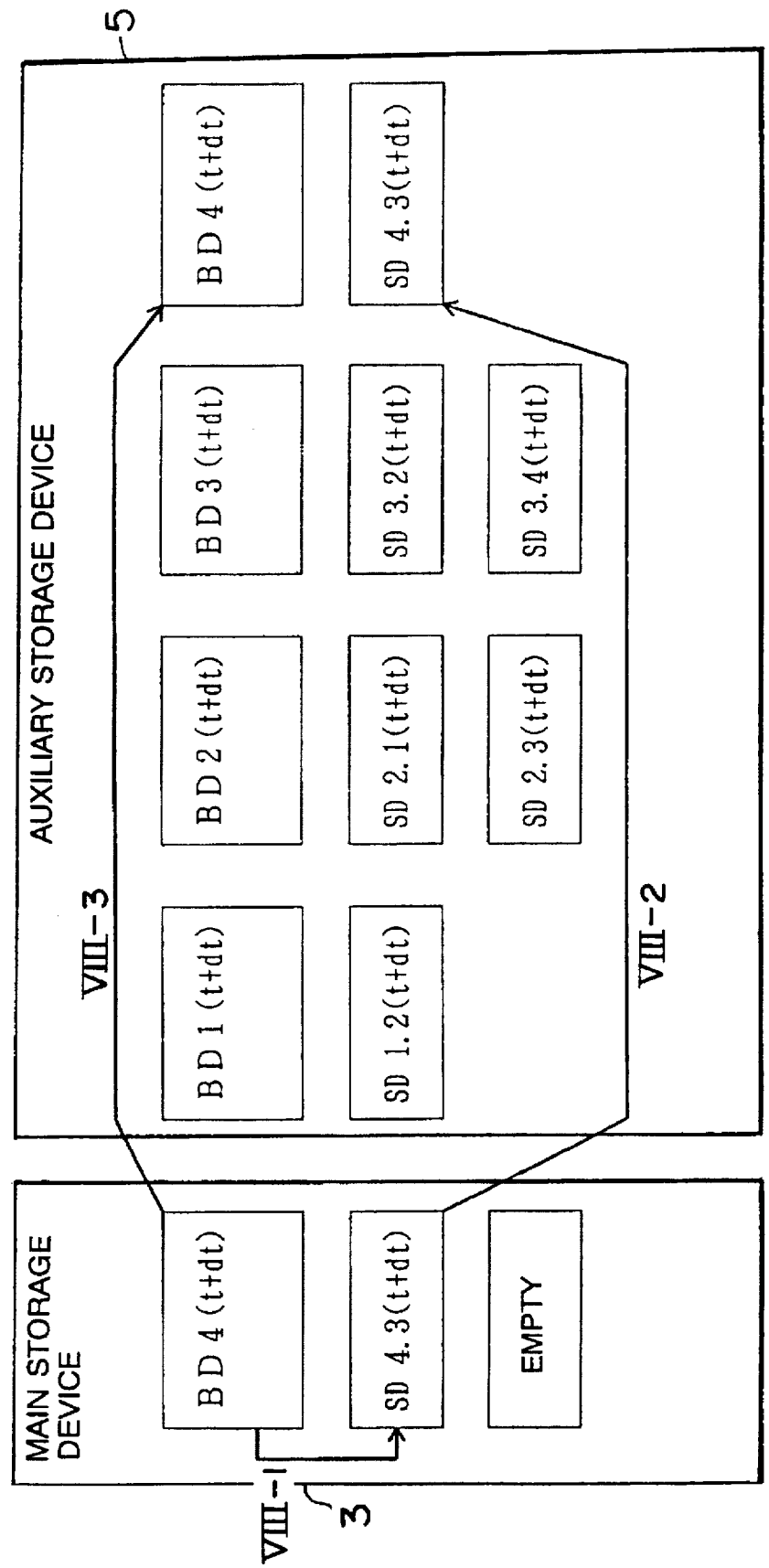
FIG. 18 is an explanatory diagram schematically showing a procedure for writing the electromagnetic wave data of the block BL4 at the timing (t+dt) to the auxiliary storage device.
Figure 19A:
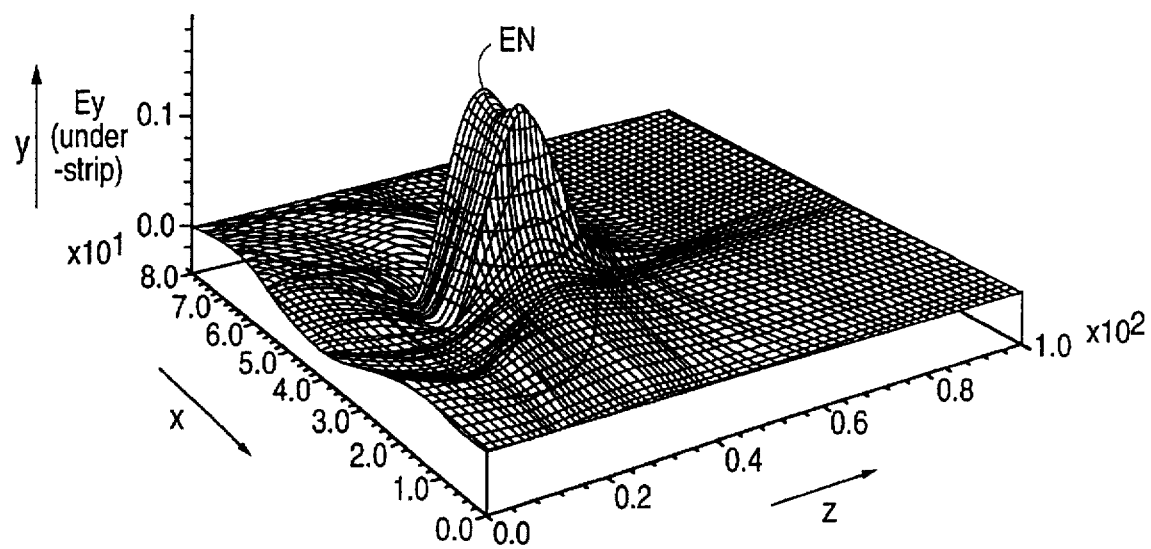
FIGS. 19a–19d are views each three-dimensionally illustrating time variations in electromagnetic wave energy propagating along the micro strip line.
Figure 19B:
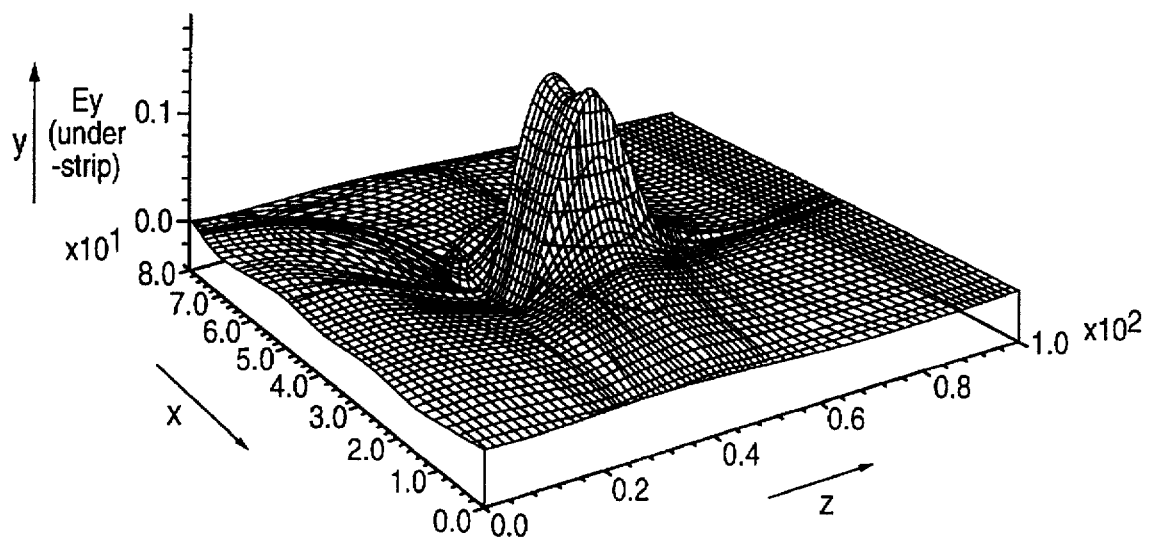
Figure 19C:
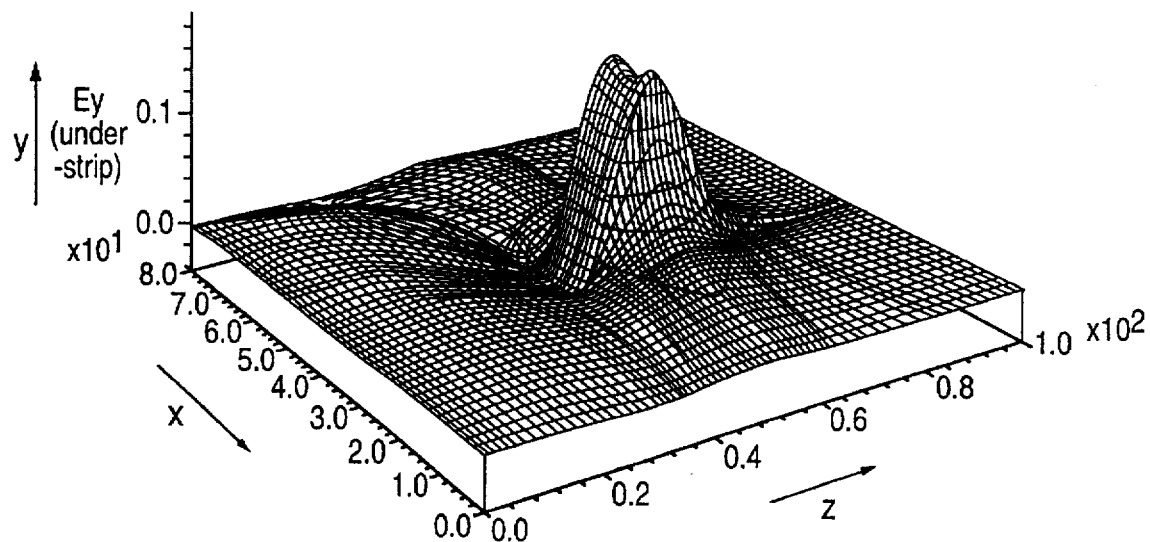
Figure 19D:
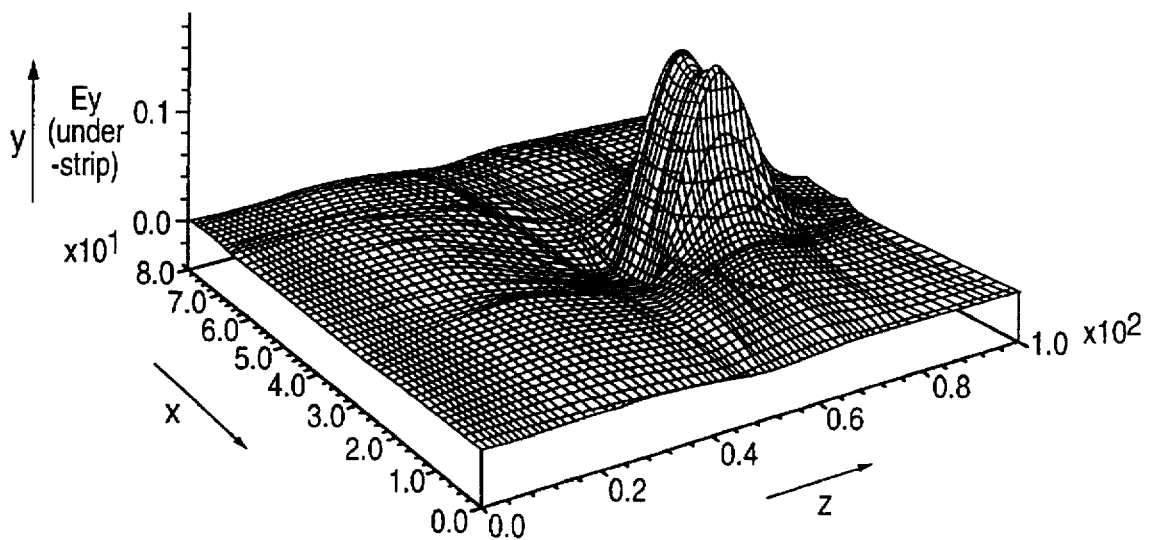
Figure 20A:
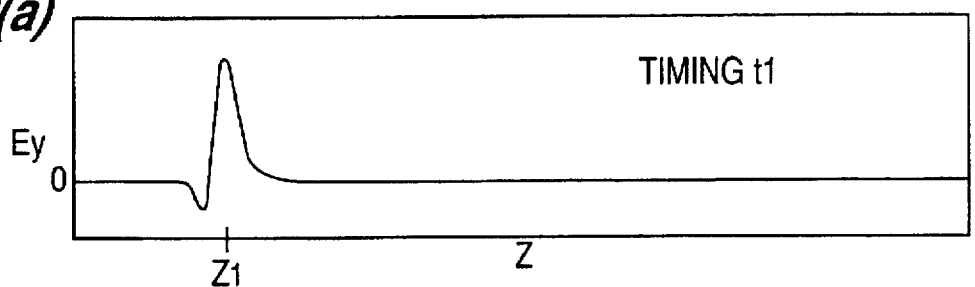
FIGS. 20a–20d are views each three-dimensionally illustrating the time variations in the electromagnetic wave energy propagating along the micro strip line.
Figure 20B:
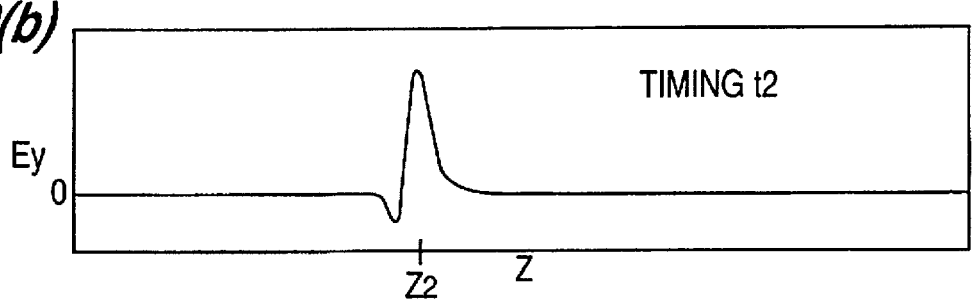
Figure 20C:
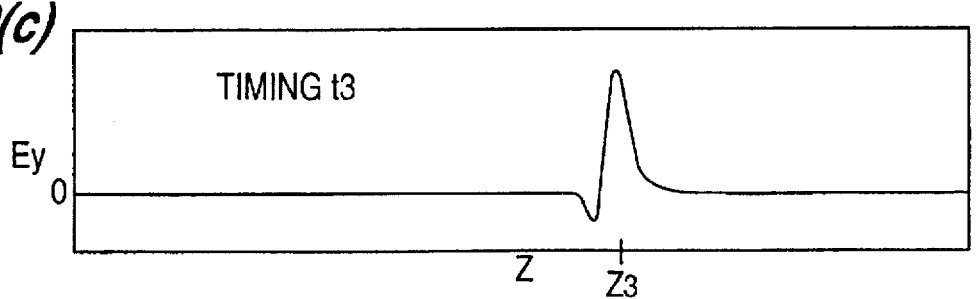
Figure 20D:
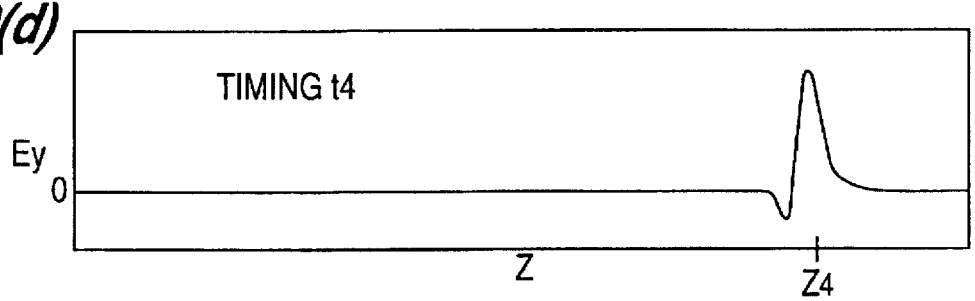

Next, as shown in FIG. 18, the CPU, as shown in FIG. 18, extracts the electromagnetic wave data SD4.3(t+dt) on the discrete lattice contiguous to the surface on the side of the block BL3 from the electromagnetic wave data BD4(t+dt) defined as a result of the calculation (VIII-1) and stores the auxiliary storage device 5 with the extracted data in such a form as to overwrite the electromagnetic wave data SD4.3(t) (VIII-2). Further, the CPU overwrites the electromagnetic wave data BD4(t) in the auxiliary storage device 5 with the electromagnetic wave data BD4(t+dt) in the main storage device 3 (VIII-3).

As discussed above, in the present wave analyzing apparatus, the main storage device 3 stores only the electromagnetic wave data of the discrete points with respect to one block among the plurality of divided blocks. Hence, the main storage device 3 may have a storage capacity enough to store the electromagnetic wave data for approximately one block, and the present wave analyzing apparatus can be actualized even by use of an electronic computer incorporating only the main storage device having a small storage capacity.

Note that the wave analyzing apparatus in the embodiment is constructed to perform the calculation required/non-required determinations with respect to all the blocks at one time but may be, as a matter of course, constructed to make, after effecting the electromagnetic wave analysis for one block, the calculation required/non-required determination for the next block. Further, calculation methods exclusive of the finite difference time domain method may be used and are applicable to a behavior analysis of the wave data other than the electromagnetic waves.

It is apparent that, in this invention, a wide range of different working modes can be formed based on the invention without deviating from the spirit and scope of the invention. This invention is not restricted by its specific working modes except being limited by the appended claims.

What is claimed is:

1. A wave analyzing apparatus for analyzing, when changing wave data of a specified discrete point within an analysis domain expressed by a plurality of discrete points, such a state that the changes thereof are propagated in the form of spatial and time variations of wave data of other discrete points, said apparatus comprising:

storage means for storing the wave data about each of the plurality of discrete points;

dividing/managing means for dividing the analysis domain into a plurality of blocks and managing these blocks;

determining means for determining whether or not magnitudes of the wave data about some pre-designated discrete points for determination that are contained in an interior of the block are all smaller than a predetermined value for every block managed by said dividing/ managing means; and analyzing means for treating, with respect to blocks in which the magnitudes of the wave data corresponding to the determination discrete points are determined to be smaller than the predetermined value by said determining means, the wave data about the respective discrete points within these blocks that have been stored in said storage means as wave data about the discrete points after the fixed time has elapsed, and for calculating, with respect to the blocks exclusive of the above-mentioned blocks, the wave data about the discrete points after a fixed time has elapsed on the basis of the wave date about the respective discrete points within these blocks the wave data being stored in said storage means.

2. A wave analyzing apparatus according to claim 1, wherein said analyzing means, in the case of calculating the wave data about the discrete points in the vicinity of a boundary of a certain block, uses the wave data about the discrete points within other block contiguous to this boundary.

3. A wave analyzing apparatus according to claim 2, wherein said determining means performs the determinations about all the blocks managed by said dividing/managing means at one time, and said analyzing means sequentially performs the analyses relative to all the blocks in which the determinations have been made by said determining means.

4. A wave analyzing apparatus according to claim 2, wherein said determining means effects the determinations about the respective blocks managed by said dividing/managing means, and said analyzing means performs, each time said determining means makes the determination about a certain block, the analysis relative to this block.

5. A wave analyzing apparatus according to claim 4, wherein the wave data is defined as electromagnetic wave data, and said analyzing means calculates the electromagnetic wave data after the fixed time has elapsed by a finite difference time domain method.

6. A wave analyzing apparatus according to claim 5, wherein the wave data at the specified discrete point is defined as pulse-like electromagnetic wave data.

7. A wave analyzing apparatus for analyzing, when changing wave data of a specified discrete point within an analysis domain expressed by a plurality of discrete points, such a state that the changes thereof are propagated in the form of spatial and time variations of wave data of other discrete points, said apparatus comprising:

dividing/managing means for dividing the analysis domain into a plurality of blocks and managing these blocks;

main storage means for storing the wave data about the discrete points for one block among the plurality of blocks;

auxiliary storage means for storing the wave data about the discrete points within the blocks the wave data of which are not stored in said main storage means;

calculating means for calculating the wave data about the discrete points within one block after a fixed time has elapsed, the wave data being stored in said main storage means, and storing said main storage means with the wave data defined as a result of the calculation; and exchanging means for exchanging the one-block wave data with which said calculating means has stored said main storage means for one-block wave data to be calculated next, which are stored in said auxiliary storage means.

8. A wave analyzing apparatus according to claim 7, further comprising:

determining means for determining whether or not magnitudes of the wave data about some pre-designated discrete points for determination that are contained in an interior of the block are all smaller than a predetermined value for every block managed by said dividing/managing means, and wherein said calculating means omits the calculations relative to blocks in which the magnitude of the wave data corresponding to the determination discrete points are determined to be smaller than the predetermined value by said determining means.

9. A wave analyzing method of analyzing, when changing wave data of a specified discrete point within an analysis domain expressed by a plurality of discrete points, such a state that the changes thereof are propagated in the form of spatial and time variations of wave data of other discrete points, said method comprising:

a dividing step of dividing the analysis domain into a plurality of blocks;

a determining step of determining whether or not magnitudes of the wave data about some pre-designated discrete points for determination that are contained in an interior of the block are all smaller than a predetermined value for every block divided in said dividing step; and an analyzing step of treating, with respect to the blocks in which the magnitudes of the wave data corresponding to the determination discrete points are determined to be smaller than the predetermined value in said determining step, the wave data about the respective discrete points within these blocks as wave data about the discrete points after the fixed time has elapsed, and calculating, with respect to the blocks exclusive of the above-mentioned blocks, the wave data about these discrete points after a fixed time has elapsed on the basis of the wave data about the respective discrete points within these blocks.

10. A wave analyzing method according to claim 9, wherein said analyzing step involves, in the case of calculating the wave data about the discrete points in the vicinity of a boundary of a certain block, using the wave data about the discrete points within other block contiguous to this boundary.

11. A wave analyzing method according to claim 10, wherein said determining step involves performing the determinations about all the blocks divided in said dividing step at one time, and said analyzing step involves sequentially performing the analyses relative to all the blocks in which the determinations have been made in said determining step.

12. A wave analyzing method according to claim 10, wherein said determining step involves individually effecting the determinations about the respective blocks divided in said dividing step, and said analyzing step involves performing, each time the determination about a certain block is made in said determining step, the analysis relative to this block.

13. A wave analyzing method according to claim 11, wherein the wave data is defined as electromagnetic wave data, and said analyzing step involves calculating the electromagnetic wave data after the fixed time has elapsed by a finite difference time domain method.

14. A wave analyzing method according to claim 13, wherein the wave data at the specified discrete point is defined as pulse-like electromagnetic wave data.

15. A wave analyzing method, used for an electronic computer including a main storage unit and an auxiliary storage unit, of analyzing, when changing wave data of a specified discrete point within an analysis domain expressed by a plurality of discrete points, such a state that the changes thereof are propagated in the form of spatial and time variations of wave data of other discrete points, said method comprising:

a dividing step of dividing the analysis domain into a plurality of blocks;

a writing step of writing the wave data about the discrete points for one block among the plurality of blocks to said main storage unit and writing the wave data about the discrete points within other blocks to said auxiliary storage unit;

a calculating step of calculating the wave data about the discrete points within one block after a fixed time has elapsed, the wave data being stored in said main storage unit, and storing said main storage unit with the wave data defined as a result of the calculation; and an exchanging step of exchanging the one-block wave data stored in said main storage unit in said calculating step for one-block wave data to be calculated next, which are stored in said auxiliary storage unit.

16. A wave analyzing method according to claim 15, further comprising:

a determining step of determining whether or not magnitudes of the wave data about some pre-designated discrete points for determination that are contained in an interior of the block are all smaller than a predetermined value for every block divided in said dividing step, and wherein said calculating step omits the calculations relative to the blocks in which the magnitude of the wave data corresponding to the determination discrete points are determined to be smaller than the predetermined value in said determining step.

* * * * *